US012736729B2

(12) United States Patent
Nakagawa et al.

(10) Patent No.: US 12,736,729 B2
(45) Date of Patent: Sep. 15, 2026

(54) OPTICAL LAMINATE, POLARIZING PLATE, AND IMAGE DEVICE DISPLAY

(71) Applicant: FUJIFILM Corporation, Tokyo (JP)

(72) Inventors: Kazushige Nakagawa, Kanagawa (JP); Miho Asahi, Kanagawa (JP); Daiki Wakizaka, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 596 days.

(21) Appl. No.: 18/186,957

(22) Filed: Mar. 21, 2023

(65) Prior Publication Data

US 2023/0228928 A1 Jul. 20, 2023

Related U.S. Application Data

(63) Continuation of application No. PCT/JP2021/035906, filed on Sep. 29, 2021.

(30) Foreign Application Priority Data

Sep. 29, 2020 (JP) ................................. 2020-162772

(51) Int. Cl.

*G02B 5/30* (2006.01)
*C08F 220/24* (2006.01)
*C08F 220/28* (2006.01)
*C08F 220/40* (2006.01)
*C08F 230/08* (2006.01)
*C09K 19/54* (2006.01)
*G02F 1/1337* (2006.01)
*G02F 1/1335* (2006.01)
*G02F 1/13363* (2006.01)
*H10K 59/80* (2023.01)

(52) U.S. Cl.

CPC .......... *G02B 5/3016* (2013.01); *C08F 220/24* (2013.01); *C08F 220/283* (2020.02); *C08F 220/40* (2013.01); *C08F 230/08* (2013.01); *C09K 19/542* (2013.01); *G02F 1/133788* (2013.01); *C09K 2019/548* (2013.01); *C09K 2219/03* (2013.01); *C09K 2323/02* (2020.08); *C09K 2323/023* (2020.08); *C09K 2323/025* (2020.08); *G02F 1/133528* (2013.01); *G02F 1/133633* (2021.01); *G02F 1/133634* (2013.01); *G02F 1/133637* (2021.01); *G02F 2413/02* (2013.01); *G02F 2413/13* (2013.01); *H10K 59/879* (2023.02); *H10K 59/8791* (2023.02)

(58) Field of Classification Search

CPC ......... G02F 1/133788; G02F 1/133633; G02F 1/133637; G02B 5/3083; C09K 2323/02; C09K 2323/023; C08F 220/24; C08F 230/08

See application file for complete search history.

(56) References Cited

U.S. PATENT DOCUMENTS

| | | | |
|---|---|---|---|
| 8,895,213 | B2 | 11/2014 | Shin |
| 8,999,613 | B2 | 4/2015 | Shin |
| 10,286,616 | B2 | 5/2019 | Tang et al. |
| 11,319,393 | B2 | 5/2022 | Tamura et al. |
| 2015/0277006 | A1 | 10/2015 | Takasago et al. |
| 2018/0031738 | A1 | 2/2018 | Ishii et al. |
| 2019/0162889 | A1 | 5/2019 | Delbaere et al. |
| 2019/0210309 | A1 | 7/2019 | Tang et al. |
| 2020/0354583 | A1 | 11/2020 | Nishikawa et al. |
| 2021/0337387 | A1 | 10/2021 | Ueno et al. |

(Continued)

FOREIGN PATENT DOCUMENTS

| | | |
|---|---|---|
| JP | 2004326089 | 11/2004 |
| JP | 2004326089 A * | 11/2004 |
| JP | 2015507214 | 3/2015 |

(Continued)

OTHER PUBLICATIONS

"Office Action of Japan Counterpart Application", issued on Sep. 24, 2024, with English translation thereof, p. 1-p. 6.
"International Search Report (Form PCT/ISA/210) of PCT/JP2021/035906", mailed on Nov. 2, 2021, with English translation thereof, pp. 1-7.
"Written Opinion of the International Searching Authority (Form PCT/ISA/237) of PCT/ JP2021/035906", mailed on Nov. 2, 2021, with English translation thereof, pp. 1-10.
"Office Action of Japan Counterpart Application", issued on May 14, 2024, with English translation thereof, p. 1-p. 8.

*Primary Examiner* — Sophie Hon
*Assistant Examiner* — Sow-fun Hon
(74) *Attorney, Agent, or Firm* — JCIPRNET

(57) ABSTRACT

An object of the present invention is to provide an optical laminate in which optically anisotropic layers exhibiting reverse wavelength dispersibility have excellent moisture-heat resistance, and the adhesiveness between a first optically anisotropic layer and a second optically anisotropic layer is excellent; and a polarizing plate and an image display device, each using the optical laminate. The optical laminate according to an embodiment of the present invention is an optical laminate having a first optically anisotropic layer and a second optically anisotropic layer, in which both of the first optically anisotropic layer and the second optically anisotropic layer are directly laminated and consist of a liquid crystal layer, at least one of the first optically anisotropic layer or the second optically anisotropic layer exhibits reverse wavelength dispersibility, a photo-alignment polymer having a photo-alignment group and a fluorine atom or a silicon atom is present on a surface of the second optically anisotropic layer on a side in contact with the first optically anisotropic layer, and an element ratio of fluorine or silicon on the surface of the second optically anisotropic layer on the side in contact with the first optically anisotropic layer is 0.05% to 15.00% by atom.

13 Claims, No Drawings

(56) References Cited

U.S. PATENT DOCUMENTS

| | | | |
|---|---|---|---|
| 2022/0035086 | A1 | 2/2022 | Delbaere et al. |
| 2022/0105697 | A1 | 4/2022 | Tang et al. |

FOREIGN PATENT DOCUMENTS

| | | | | | |
|---|---|---|---|---|---|
| JP | 2015507214 | A | * | 3/2015 | ......... G03F 7/70733 |
| JP | 2016053709 | | | 4/2016 | |
| JP | 2017097331 | | | 6/2017 | |
| JP | 2019522245 | | | 8/2019 | |
| JP | 2019522245 | A | * | 8/2019 | ............... G02B 5/32 |
| JP | 2020013133 | | | 1/2020 | |
| JP | 7655931 | B2 | * | 4/2025 | ....... G02F 1/133788 |
| WO | 2016114254 | | | 7/2016 | |
| WO | 2018216812 | | | 11/2018 | |
| WO | 2019116989 | | | 6/2019 | |
| WO | WO-2019116989 | A1 | * | 6/2019 | ............... G02F 1/13 |
| WO | 2019159707 | | | 8/2019 | |
| WO | 2020145279 | | | 7/2020 | |
| WO | 2020145297 | | | 7/2020 | |

* cited by examiner

OPTICAL LAMINATE, POLARIZING PLATE, AND IMAGE DEVICE DISPLAY

CROSS-REFERENCE TO RELATED APPLICATIONS

This application is a Continuation of PCT International Application No. PCT/JP2021/035906 filed on Sep. 29, 2021, which claims priority under 35 U.S.C. § 119(a) to Japanese Patent Application No. 2020-162772 filed on Sep. 29, 2020. The above applications are hereby expressly incorporated by reference, in their entirety, into the present application.

BACKGROUND OF THE INVENTION

1. Field of the Invention

The present invention relates to an optical laminate, a polarizing plate, and an image display device.

2. Description of the Related Art

Optical films such as an optical compensation sheet and a phase difference film are used in various image display devices in terms of elimination of image coloration, expansion of a viewing angle, and the like.

A stretched birefringent film has been used as the optical film, but in recent years, an optically anisotropic layer formed using a liquid crystal compound instead of the stretched birefringent film has been proposed.

In the formation of such an optically anisotropic layer, a photo-alignment film obtained by performing a photo-alignment treatment is used in some cases in order to align a liquid crystal compound.

For example, WO2018/216812A describes an aspect in which a binder layer is formed using a predetermined photo-alignment polymer having a repeating unit including a cleaving group that decomposes by an action of at least one selected from the group consisting of light, heat, an acid, and a base to generate a polar group, and an optically anisotropic layer is provided on an upper layer thereof (see [claim 1], [claim 7] to [claim 9], and the like), and Example 6 describes a method in which a binder layer (liquid crystal layer) using a photo-alignment polymer KH3 represented by the following formula is formed, and an optically anisotropic layer is formed on an upper layer thereof

KH3

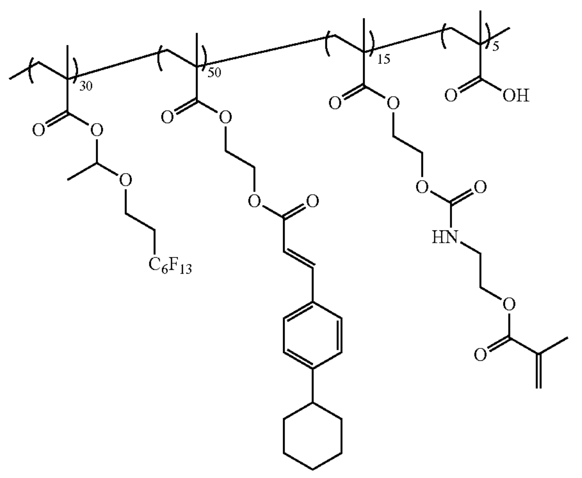

In addition, Comparative Example 3 of WO2019/159707A describes a method in which a binder layer (liquid crystal layer) using a photo-alignment polymer H2 represented by the following formula is formed, and an optically anisotropic layer is formed on an upper layer thereof.

H2

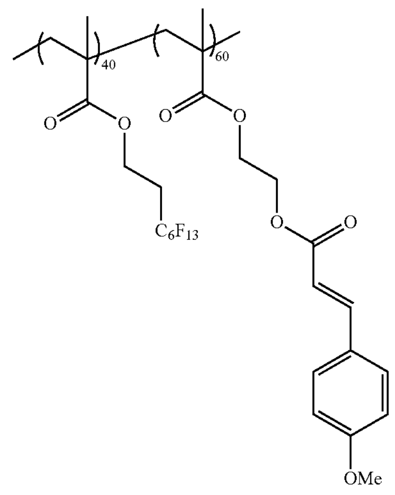

SUMMARY OF THE INVENTION

The present inventors have conducted studies on a photo-alignment polymer having a fluorine atom or a silicon atom among the photo-alignment polymers specifically described in WO2018/216812A, WO2019/159707A, and the like.

Specifically, the present inventors have conducted studies on an optical laminate having a liquid crystal layer formed using a composition containing a photo-alignment polymer having a fluorine atom or a silicon atom and a liquid crystal compound (a second optically anisotropic layer), and a liquid crystal layer (first optically anisotropic layer) directly laminated on an upper layer thereof, and have clarified that at least one of the first optically anisotropic layer or the second optically anisotropic layer is an optically anisotropic layer exhibiting reverse wavelength dispersibility, and there is room for improvement in the moisture-heat resistance of the optically anisotropic layer exhibiting reverse wavelength dispersibility in a bonding to a panel, and the like.

In addition, the present inventors have conducted studies on the optical laminate, and have clarified that there is room for improvement in the adhesiveness between the first optically anisotropic layer and the second optically anisotropic layer depending on the type of the photo-alignment polymer having a fluorine atom or a silicon atom.

Therefore, an object of the present invention is to provide an optical laminate in which optically anisotropic layers exhibiting reverse wavelength dispersibility have excellent moisture-heat resistance, and the adhesiveness between a first optically anisotropic layer and a second optically anisotropic layer is excellent; and a polarizing plate and an image display device, each using the optical laminate.

The present inventors have conducted intensive studies in order to accomplish the object, and as a result, they have found that an optical laminate having a first optically anisotropic layer and a second optically anisotropic layer, both of the first optically anisotropic layer and the second optically anisotropic layer are directly laminated and consist of a liquid crystal layer; and in a case where at least one of the first optically anisotropic layer or the second optically anisotropic layer exhibits reverse wavelength dispersibility, by allowing a photo-alignment polymer to be present such that the element ratio of fluorine or silicon is a specific amount, the moisture-heat resistance of the optically anisotropic layers exhibiting reverse wavelength dispersibility is improved and the adhesiveness between the first optically anisotropic layer and the second optically anisotropic layer is improved, thereby completing the present invention.

That is, the present inventors have found that the object can be accomplished by the following configurations.

[1] An optical laminate comprising:

a first optically anisotropic layer; and a second optically anisotropic layer, in which both of the first optically anisotropic layer and the second optically anisotropic layer are directly laminated and consist of a liquid crystal layer, at least one of the first optically anisotropic layer or the second optically anisotropic layer exhibits reverse wavelength dispersibility, a photo-alignment polymer having a photo-alignment group and a fluorine atom or a silicon atom is present on a surface of the second optically anisotropic layer on a side in contact with the first optically anisotropic layer, and an element ratio of fluorine or silicon on the surface of the second optically anisotropic layer on the side in contact with the first optically anisotropic layer is 0.05% to 15.00% by atom.

[2] The optical laminate as described in [1], in which the photo-alignment group is a photo-alignment group that undergoes at least one of dimerization or isomerization by an action of light.

[3] The optical laminate as described in [1] or [2], in which the photo-alignment group is selected from the group consisting of a cinnamoyl group, an azobenzene group, a chalconyl group, and a coumarin group.

[4] The optical laminate as described in any one of [1] to [3], in which the photo-alignment polymer has a repeating unit represented by Formula (A) which will be described later.

[5] The optical laminate as described in any one of [1] to [4], in which the photo-alignment polymer has a partial structure represented by Formula (1).

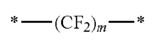

$$* - (CF_2)_m - * \quad (1)$$

Here, in Formula (1), * represents a bonding position, and m represents an integer of 2 to 20.

[6] The optical laminate as described in any one of [1] to [5], in which the photo-alignment polymer has a group represented by Formula (2).

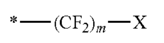

$$* - (CF_2)_m - X \quad (2)$$

Here, in Formula (2), * represents a bonding position, m represents an integer of 2 to 20, and X represents a hydrogen atom or a fluorine atom.

[7] The optical laminate as described in [6], in which X in Formula (2) represents a hydrogen atom.

[8] The optical laminate as described in any one of [1] to [4], in which the photo-alignment polymer has a group represented by Formula (3).

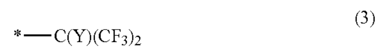

$$* - C(Y)(CF_3)_2 \quad (3)$$

Here, in Formula (3), * represents a bonding position, and Y represents a hydrogen atom or a substituent.

[9] The optical laminate as described in any one of [1] to [8], in which at least one of the first optically anisotropic layer or the second optically anisotropic layer is an optically anisotropic layer in which an alignment of a liquid crystal compound having any of aromatic rings selected from the group consisting of groups represented by Formulae (Ar-1) to (Ar-7) which will be described later is immobilized.

[10] The optical laminate as described in any one of [1] to [9], in which the first optically anisotropic layer is a positive A plate.

[11] The optical laminate as described in any one of [1] to [10], in which the second optically anisotropic layer is a positive C plate.

[12] A polarizing plate comprising:

the optical laminate as described in any one of [1] to [11]; and a polarizer.

[13] An image display device comprising:

the optical laminate as described in any one of [1] to [11] or the polarizing plate as described in [12].

According to the present invention, it is possible to provide an optical laminate in which optically anisotropic layers exhibiting reverse wavelength dispersibility have excellent moisture-heat resistance, and the adhesiveness between a first optically anisotropic layer and a second optically anisotropic layer is excellent; and a polarizing plate and an image display device, each using the optical laminate.

DESCRIPTION OF THE PREFERRED EMBODIMENTS

Hereinafter, the present invention will be described in detail.

The following description of the constitutional requirements is made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit value and the upper limit value, respectively.

In addition, in the present specification, for each component, a substance corresponding to each component may be used alone or in combination of two or more kinds thereof. Here, in a case where the two or more kinds of substances are used in combination for each component, the content of the component refers to a total content of the substances used in combination unless otherwise specified.

Moreover, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

In addition, the bonding direction of a divalent group (for example, —O—CO—) as noted in the present specification is not particularly limited, and for example, in a case where in the bond of "$L^1$-$L^2$-$L^3$", $L^2$ is —O—CO—, $L^2$ may be either *1-O—CO—*2 or *1-CO—O—*2, where *1 and *2 represent a bonding position to the $L^1$ side and a bonding position to the $L^3$ side, respectively.

[Optical Laminate]

The optical laminate according to an embodiment of the present invention is an optical laminate in which a first optically anisotropic layer and a second optically anisotropic layer are directly laminated.

In addition, in the optical laminate of the embodiment of the present invention, both of the first optically anisotropic layer and the second optically anisotropic layer consist of a liquid crystal layer, and at least one of the first optically anisotropic layer or the second optically anisotropic layer exhibits reverse wavelength dispersibility.

Furthermore, in the optical laminate according to the embodiment of the present invention, a photo-alignment polymer having a photo-alignment group and a fluorine atom or a silicon atom is present on a surface of the second optically anisotropic layer on a side in contact with the first optically anisotropic layer, and an element ratio of fluorine or silicon on the surface of the second optically anisotropic layer on the side in contact with the first optically anisotropic layer is 0.05% to 15.00% by atom.

Here, the optically anisotropic layer exhibiting reverse wavelength dispersibility is an optically anisotropic layer having an in-plane retardation value Re(450) measured at a wavelength of 450 nm, an in-plane retardation value Re(550) measured at a wavelength of 550 nm, and an in-plane retardation value Re(650) measured at a wavelength of 650 nm, which satisfy a relationship of Re(450)<Re(550)<Re(650).

In addition, the value of the in-plane retardation refers to a value measured with light at the measurement wavelength using AxoScan OPMF-1 (manufactured by Opto Science, Inc.).

Specifically, by inputting an average refractive index ((Nx+Ny+Nz)/3) and a film thickness (d(μm)) to AxoScan OPMF-1, it is possible to calculate:

Slow axis direction (°)

$$Re(\lambda)=R0(\lambda)$$

$$Rth(\lambda)=((nx+ny)/2-nz)\times d. \qquad \text{Slow axis direction (°)}$$

In addition, R0(λ) is expressed in a numerical value calculated with AxoScan OPMF-1, but means Re(λ).

In the present invention, in a predetermined optical laminate in which a first optically anisotropic layer and a second optically anisotropic layer are directly laminated as mentioned above, by allowing a photo-alignment polymer to be present such that an element ratio of fluorine or silicon on a surface of the second optically anisotropic layer on a side in contact with the first optically anisotropic layer is 0.05% to 15.00% by atom, the moisture-heat resistance of the optically anisotropic layers exhibiting reverse wavelength dispersibility is improved and the adhesiveness between the first optically anisotropic layer and the second optically anisotropic layer is improved.

A reason thereof is not specifically clear, but is presumed to be as follows by the present inventors.

First, as shown in Comparative Examples 1 and 3 which will be described later, it is found that the element ratio of fluorine or silicon on the surface of the second optically anisotropic layer on the side in contact with the first optically anisotropic layer is more than 15% by atom, the adhesiveness between the first optically anisotropic layer and the second optically anisotropic layer is deteriorated. This is considered to be caused by the deterioration of the coatability of the composition for forming a first optically anisotropic layer in a case where the first optically anisotropic layer is directly formed on the upper layer of the second optically anisotropic layer.

In addition, as shown in Comparative Examples 2 and 4 which will be described later, it is found that in a case where a photo-alignment polymer having a photo-alignment group and a fluorine atom or a silicon atom is not present on a surface of the second optically anisotropic layer on a side in contact with the first optically anisotropic layer, the moisture-heat resistance of the optically anisotropic layer exhibiting reverse wavelength dispersibility is deteriorated. This is considered to be caused by the decomposition of a liquid crystal compound constituting an optically anisotropic layer exhibiting reverse wavelength dispersibility, having weaker moisture-heat resistance by allowing a moisture in the system to freely move at an interface between the first optically anisotropic layer and the second optically anisotropic layer.

Therefore, in the present invention, it is considered that by allowing the photo-alignment polymer to be present such that the element ratio of fluorine or silicon is 0.05% to 15.00% by atom on the surface of the second optically anisotropic layer on the side in contact with the first optically anisotropic layer, the coatability in forming the first optically anisotropic layer as the upper layer of the second optically anisotropic layer is not affected, and after the production of an optical laminate, the movement of the moisture in the system is blocked by the fluorine atom or the silicon atom present on the surface of the second optically anisotropic layer on the side in contact with the first optically anisotropic layer, whereby the moisture-heat resistance of the optically anisotropic layer exhibiting reverse wavelength dispersibility is improved and the adhesiveness between the first optically anisotropic layer and the second optically anisotropic layer is improved.

Hereinbelow, first, the second optically anisotropic layer having a photo-alignment polymer will be described in detail, and then the first optically anisotropic layer as the upper layer will be described in detail.

[Second Optically Anisotropic Layer]

The optical laminate according to the embodiment of the present invention has a photo-alignment polymer having a photo-alignment group and a fluorine atom or a silicon atom on a surface of the second optically anisotropic layer on a side in contact with the first optically anisotropic layer (hereinafter also simply referred to as the "photo-alignment polymer of the present invention").

In addition, in the optical laminate of the embodiment of the present invention, the element ratio of fluorine or silicon on the surface of the second optically anisotropic layer on the side in contact with the first optically anisotropic layer is 0.05% to 15.00% by atom.

Here, the surface of the second optically anisotropic layer on the side in contact with the first optically anisotropic layer is a region ranging from a depth position corresponding to 80% of a total thickness of the second optical layer to a position serving as an interface with the first optically anisotropic layer, from a surface of the second optically anisotropic layer on the side opposite to the first optically anisotropic layer toward the side of the first optically anisotropic layer side, and is also simply referred to as a "surface layer A".

In addition, the presence or absence of the photo-alignment polymer on the surface layer A of the second optically anisotropic layer can be confirmed by, for example, a time-of-flight secondary ion mass spectrometry (TOF-SIMS). Furthermore, for TOF-SIMS, the method described in "Surface Analysis Technology Library Secondary Ion Mass Spectrometry" edited by the Surface Science Society of Japan and published by Maruzen Co., Ltd. (published in 1999) can be adopted.

Specifically, in a case where a photo-alignment polymer having a photo-alignment group and a fluorine atom or a silicon atom is present on a surface of the second optically anisotropic layer on a side in contact with the first optically anisotropic layer, that is, at an interface between the first optically anisotropic layer and the second optically anisotropic layer, all of fragments derived from the photo-alignment group and fragments derived from the unit having a fluorine atom or a silicon atom are detected at the same positions near the interface.

On the other hand, the element ratio of fluorine or silicon on the surface of the second optically anisotropic layer on the side in contact with the first optically anisotropic layer refers to an element ratio measured by the following procedure.

First, a polyethylene terephthalate (PET) tape is attached onto a surface of the first optically anisotropic layer on a side opposite to the second optically anisotropic layer, and the base material of the optical laminate is peeled (the first optically anisotropic layer and the second optically anisotropic layer are transferred).

Next, a secondary ion intensity derived from fluorine or silicon in the second optically anisotropic layer is measured by TOF-SIMS upon irradiation with ion beams from a surface of the second optically anisotropic layer on a side opposite to the first optically anisotropic layer side.

Next, the irradiation with the ion beams is stopped at a position where the secondary ion intensity derived from fluorine or silicon is maximized in a region ranging from a depth position corresponding to 80% of a total thickness of the second optical layer to a position serving as an interface with the first optically anisotropic layer, from a surface of the second optically anisotropic layer on the side opposite to the first optically anisotropic layer toward the side of the first optically anisotropic layer side.

Then, the element ratio of fluorine or silicon is calculated for sections irradiated with ion beams by X-ray photoelectron spectroscopy (XPS).

<Photo-Alignment Polymer>

As described above, the photo-alignment polymer of the present invention is a photo-alignment polymer having a photo-alignment group and a fluorine atom or a silicon atom.

For the reason that the thermal stability and the chemical stability of the monomer having a photo-alignment group are improved, it is preferable that the photo-alignment group is a group that undergoes at least one of dimerization or isomerization by the action of light.

Specific suitable examples of the group to be dimerized by the action of light include a group having a skeleton of at least one derivative selected from the group consisting of a cinnamic acid derivative, a coumarin derivative, a chalcone derivative, a maleimide derivative, and a benzophenone derivative.

On the other hand, specific suitable examples of the group to be isomerized by the action of light include a group having a skeleton of at least one compound selected from the group consisting of an azobenzene compound, a stilbene compound, a spiropyran compound, a cinnamic acid compound, and a hydrazono-β-ketoester compound.

Among such photo-alignment groups, for the reason that the alignment of the first optically anisotropic layer formed on the upper layer (hereinafter simply referred to as a "liquid crystal alignment") is further improved even with a small exposure amount, a photo-alignment group selected from the group consisting of a cinnamoyl group, an azobenzene group, a chalconyl group, and a coumarin group is preferable, and the cinnamoyl group is more preferable.

The photo-alignment polymer of the present invention is preferably a polymer having a repeating unit including a photo-alignment group, and specifically, any of a polymer having a repeating unit including a fluorine atom or a silicon atom together with a photo-alignment group, and a copolymer having a repeating unit including a photo-alignment group and a repeating unit containing a fluorine atom or a silicon atom is preferable.

As the repeating unit including a photo-alignment group, a repeating unit represented by Formula (A) (hereinafter also simply referred to as a "repeating unit A") is preferable for the reason that the liquid crystal alignment properties are improved.

(A)

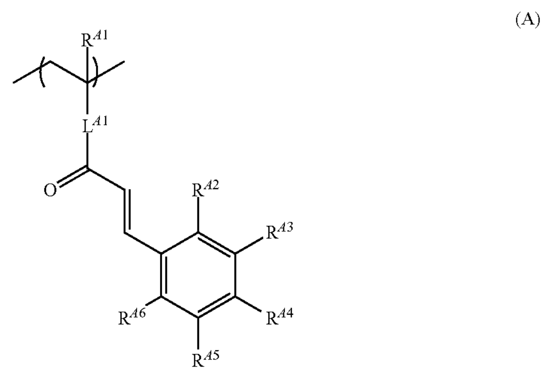

In Formula (A), $R^{A1}$ represents a hydrogen atom or a substituent.

Moreover, $L^{A1}$ represents a single bond or a divalent linking group.

In addition, $R^{A2}$, $R^{A3}$, $R^{A4}$, $R^{A5}$, and $R^{A6}$ each independently represent a hydrogen atom or a substituent. Two adjacent groups of $R^{A2}$, $R^{A3}$, $R^{A4}$, $R^{A5}$, and $R^{A6}$ may be bonded to each other to form a ring.

In Formula (A), $R^{A1}$ represents a hydrogen atom or a substituent.

The type of the substituent represented by one aspect of $R^{A1}$ is not particularly limited, and examples thereof include known substituents.

Examples of the substituent include a monovalent aliphatic hydrocarbon group which may have an oxygen atom, and a monovalent aromatic hydrocarbon group which may have an oxygen atom, and more specifically include an alkyl group, an alkenyl group, an alkynyl group, an aryl group, an alkoxy group, an aryloxy group, an acyl group, an acyloxy group, and a group formed by combination of these groups. Further, the substituent may further be substituted with a substituent.

Among these substituents, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In Formula (A), $L^{A1}$ represents a single bond or a divalent linking group.

Examples of the divalent linking group represented by one aspect of $L^{A1}$ include a divalent hydrocarbon group which may have a substituent, a divalent heterocyclic group, —O—, —S—, —N(Q)-, —CO—, or a group formed by combination of these groups. Q represents a hydrogen atom or a substituent.

Examples of the divalent hydrocarbon group include divalent aliphatic hydrocarbon groups such as an alkylene group having 1 to 10 carbon atoms (preferably having 1 to 5 carbon atoms), an alkenylene group having 1 to 10 carbon atoms, and an alkynylene group having 1 to 10 carbon atoms; and divalent aromatic hydrocarbon groups such as an arylene group.

Examples of the divalent heterocyclic group include divalent aromatic heterocyclic groups, and specifically include a pyridylene group (pyridine-diyl group), a pyridazine-diyl group, an imidazole-diyl group, a thienylene (thiophene-diyl group), and a quinolylene group (quinoline-diyl group).

In addition, examples of the group formed by combination of a group obtained by combining at least two or more selected from the group consisting of the divalent hydrocarbon groups, the divalent heterocyclic groups, —O—, —S—, —N(Q)-, and —CO—, mentioned above, such as —CO—O-divalent hydrocarbon group-O—, —CO—NH-divalent hydrocarbon group-O—, O-divalent hydrocarbon group, —(O-divalent hydrocarbon group)$_p$-O— (p represents an integer of 1 or more), -divalent hydrocarbon group-O—CO—, and —CO—NH-divalent hydrocarbon group-O—.

Among these divalent linking groups, for the reason that the liquid crystal alignment properties are further improved, a divalent linking group formed by combination of at least two or more groups selected from the group consisting of a linear alkylene group having 1 to 10 carbon atoms, which may have a substituent, a branched or cyclic alkylene group having 3 to 10 carbon atoms, which may have a substituent, an arylene group having 6 to 12 carbon atoms, which may have a substituent, —O—, —CO—, and —N(Q)- is preferable. Q represents a hydrogen atom or a substituent.

Here, with regard to the divalent linking group represented by one aspect of $L^{A1}$, examples of the substituent which may be contained in the above-mentioned hydrocarbon group, the substituent which may be contained in the heterocyclic group may have, and the substituent represented by Q include a halogen atom, an alkyl group, an alkoxy group, an aryl group, an aryloxy group, a cyano group, a carboxy group, an alkoxycarbonyl group, and a hydroxyl group.

In Formula (A), $R^{A2}$, $R^{A3}$, $R^{A4}$, $R^{A5}$, and $R^{A6}$ each independently represent a hydrogen atom or a substituent. The type of the substituent is not particularly limited, examples of the substituent include known substituents, such as the groups exemplified as the substituent represented by one aspect of $R^{A1}$ in Formula (A).

Two adjacent groups of $R^{A2}$, $R^{A3}$, $R^{A4}$, $R^{A5}$, and $R^{A6}$ may be bonded to each other to form a ring.

For the reason that the liquid crystal alignment properties are further improved, the substituents represented by $R^{A2}$, $R^{A3}$, $R^{A4}$, $R^{A5}$, and $R^{A6}$ are each independently preferably a halogen atom, a linear alkyl group having 1 to 20 carbon atoms, a branched or cyclic alkyl group having 3 to 20 carbon atoms, a linear alkyl halide group having 1 to 20 carbon atoms, an alkoxy group having 1 to 20 carbon atoms, an aryl group having 6 to 20 carbon atoms, an aryloxy group having 6 to 20 carbon atoms, a hydroxy group, a cyano group, an amino group, or a group represented by Formula (4). Furthermore, the substituent may include a linking group represented by $—(CH_2)_{an}—$ or $—O—(CH_2)_{na}—$. na represents an integer of 1 to 10.

(4)

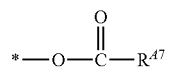

Here, in Formula (4), * represents a bonding position.

$R^{A7}$ represents an alkyl group having 1 to 20 carbon atoms.

Examples of the halogen atom include a fluorine atom, a chlorine atom, a bromine atom, and an iodine atom, and the fluorine atom or the chlorine atom is preferable.

The linear alkyl group is preferably an alkyl group having 1 to 6 carbon atoms, and examples thereof include a methyl group, an ethyl group, and an n-propyl group.

The branched alkyl group is preferably an alkyl group having 3 to 6 carbon atoms, and examples thereof include an isopropyl group and a tert-butyl group.

The cyclic alkyl group is preferably an alkyl group having 3 to 6 carbon atoms, and examples thereof include a cyclopropyl group, a cyclopentyl group, and a cyclohexyl group.

As the linear alkyl halide group having 1 to 20 carbon atoms, a fluoroalkyl group having 1 to 12 carbon atoms is preferable, and examples thereof include a trifluoromethyl group, a perfluoroethyl group, a perfluoropropyl group, a perfluorobutyl group, a 2,2,3,3,4,4,5,5-octafluoropentyl group, and a 2,2,3,3,4,4,5,5,6,6,7,7-dodecafluoroheptyl group. Among those, for the reason that the moisture-heat resistance of the optically anisotropic layer exhibiting reverse wavelength dispersibility is further improved, and the adhesiveness between the first optically anisotropic layer and the second optically anisotropic layer is further improved, the 2,2,3,3,4,4,5,5-octafluoropentyl group or the 2,2,3,3,4,4,5,5,6,6,7,7-dodecafluoroheptyl group is preferable.

As the alkoxy group having 1 to 20 carbon atoms, an alkoxy group having 1 to 18 carbon atoms is preferable, an alkoxy group having 3 to 18 carbon atoms is more preferable, and an alkoxy group having 6 to 18 carbon atoms is still more preferable. Examples thereof include a methoxy group, an ethoxy group, an n-butoxy group, a methoxyethoxy group, an n-hexyloxy group, an n-octyloxy group, an n-decyloxy group, an n-dodecyloxy group, and an n-tetradecyloxy group.

As the aryl group having 6 to 20 carbon atoms, an aryl group having 6 to 12 carbon atoms is preferable, and examples thereof include a phenyl group, an α-methylphenyl group, and a naphthyl group.

As the aryloxy group having 6 to 20 carbon atoms, an aryloxy group having 6 to 12 carbon atoms is preferable, and examples thereof include a phenyloxy group and a 2-naphthyloxy group.

Examples of the amino group include primary amino groups ($—NH_2$); secondary amino groups such as a methylamino group; tertiary amino groups such as a dimethyl-amino group, a diethylamino group, a dibenzylamino group, and a group having a nitrogen atom of a nitrogen-containing heterocyclic compound (for example, pyrrolidine, piperidine, and piperazine) as a bond.

For the reason that the photo-alignment group easily interacts with the liquid crystal compound and the liquid crystal alignment properties are further improved, it is preferable that at least $R^{A4}$ among $R^{A2}$, $R^{A3}$, $R^{A4}$, $R^{A5}$, or $R^{A6}$ in Formula (A) represents the above-mentioned substituent (preferably an alkoxy group having 1 to 20 carbon atoms or an alkyl halide group), and further, for the reason that the linearity of the obtained photo-alignment polymer is improved, the photo-alignment polymer is more likely to interact with the liquid crystal compound, and the liquid crystal alignment properties are further improved, it is more preferable that $R^{A2}$, $R^{A3}$, $R^{A5}$, and $R^{A6}$ all represent a hydrogen atom.

Specific examples of the repeating unit A including a photo-alignment group include repeating units represented by Formulae A-1 to A-30. Furthermore, the repeating unit represented by Formula A-30 corresponds to a repeating unit including a fluorine atom together with a photo-alignment group.

A-1

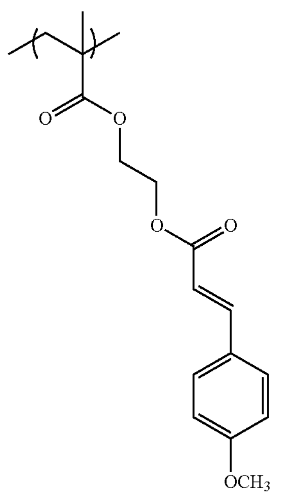

A-2

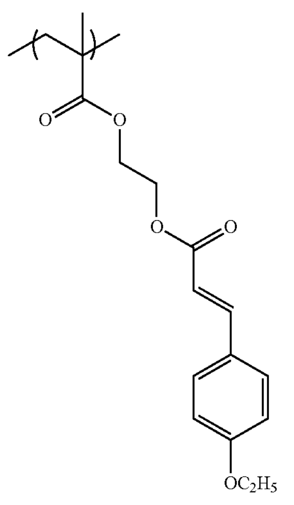

-continued

A-3

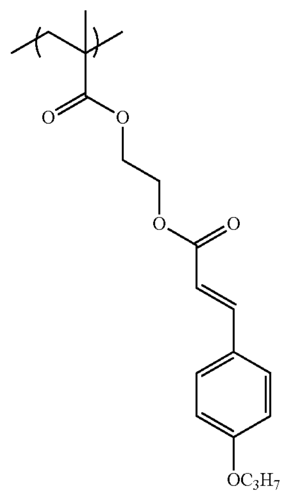

A-4

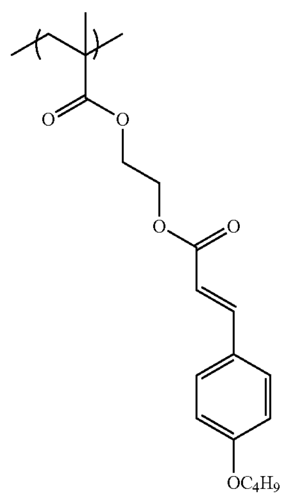

A-5

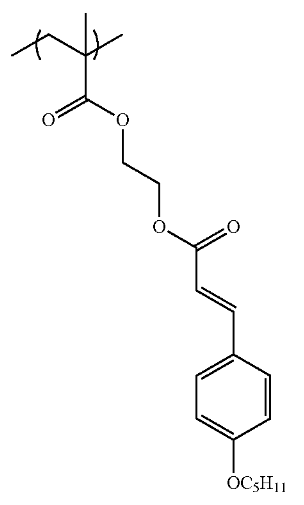

-continued
A-6
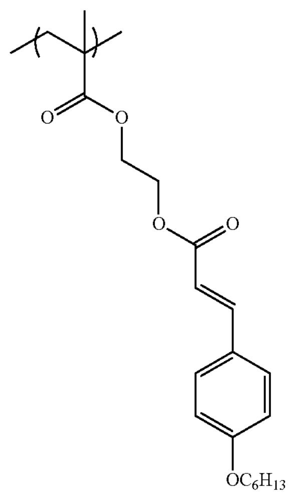
A-7
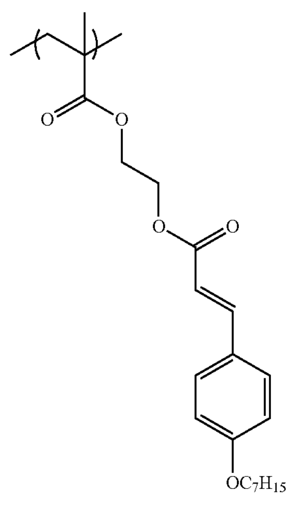
A-8
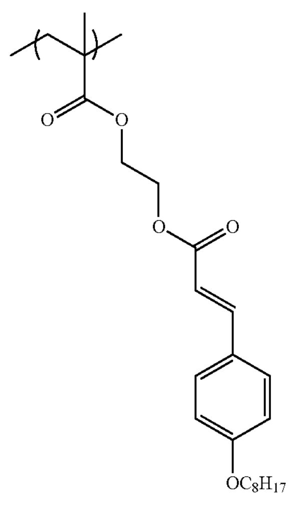
-continued
A-9
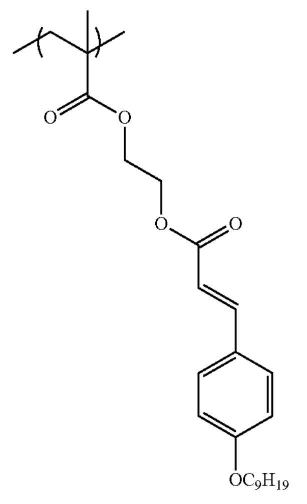
A-10
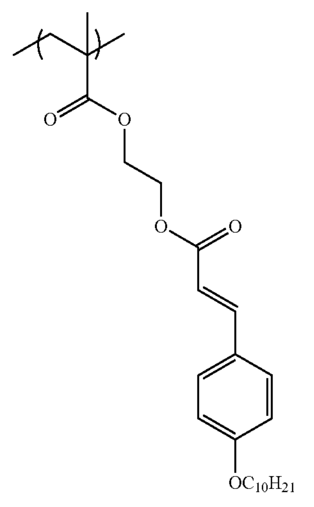
A-11
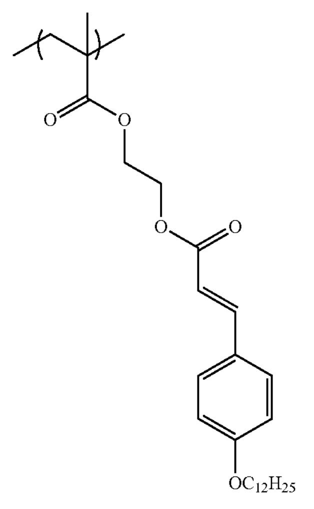

-continued
A-12
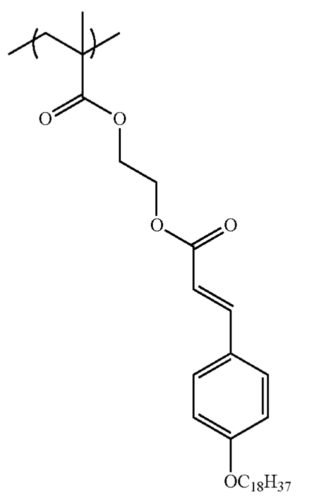
A-13
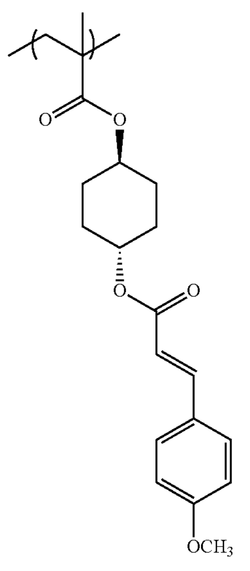
A-14
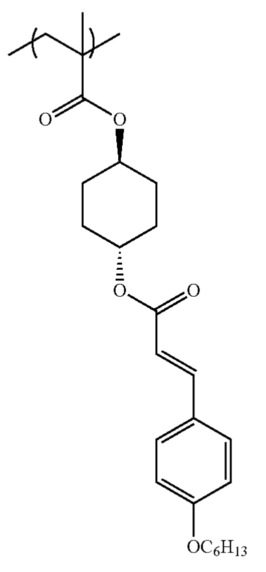
-continued
A-15
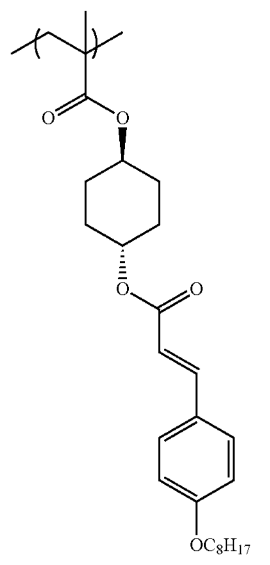
A-16
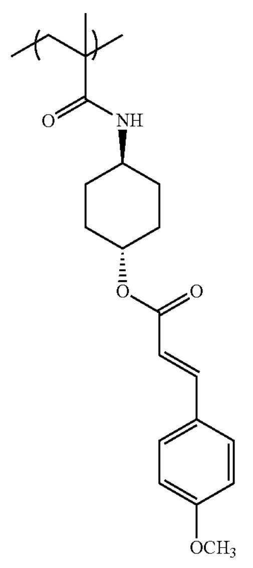
A-17
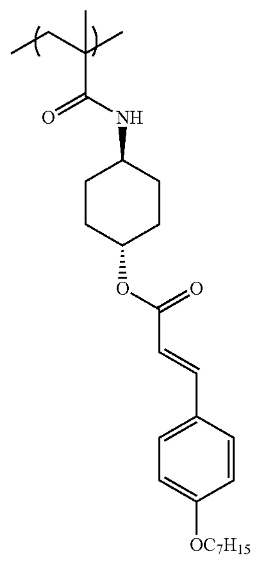

-continued
A-18
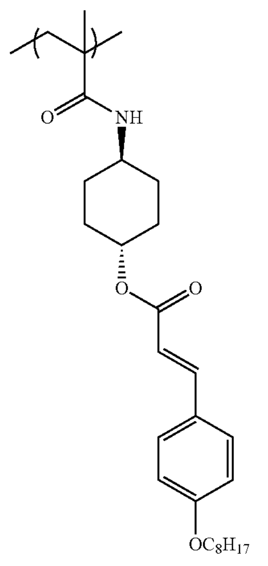
A-19
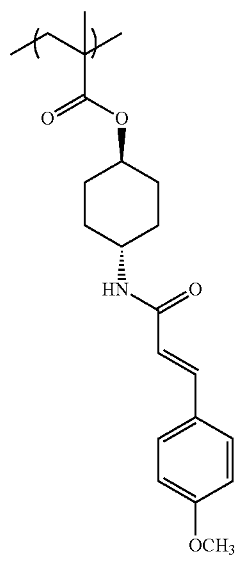
A-20
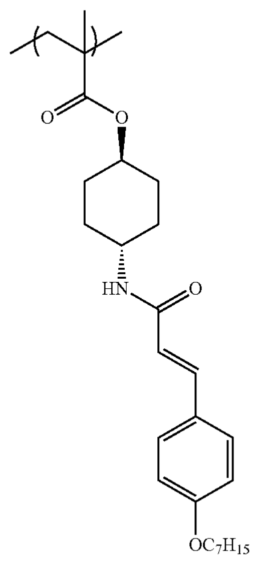
-continued
A-21
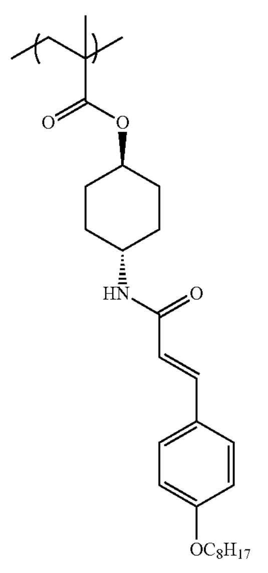
A-22
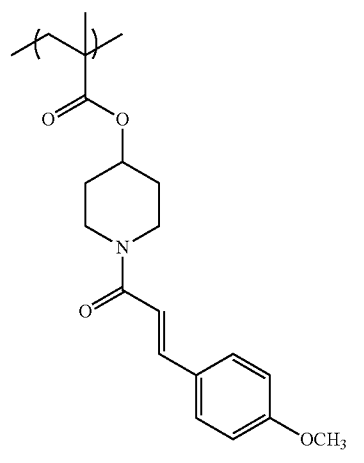
A-23
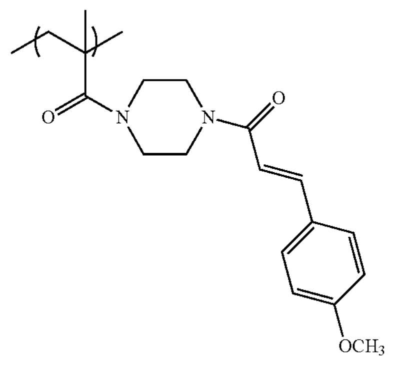

-continued
A-24
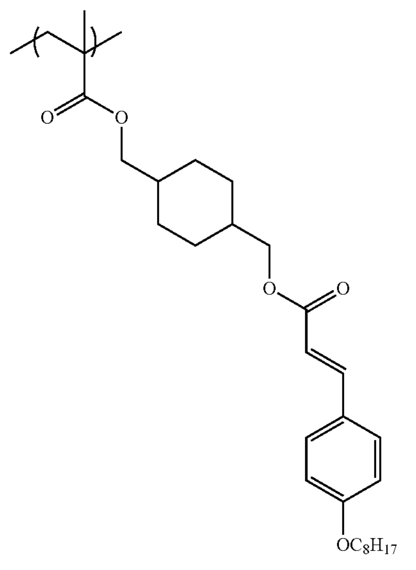
A-25
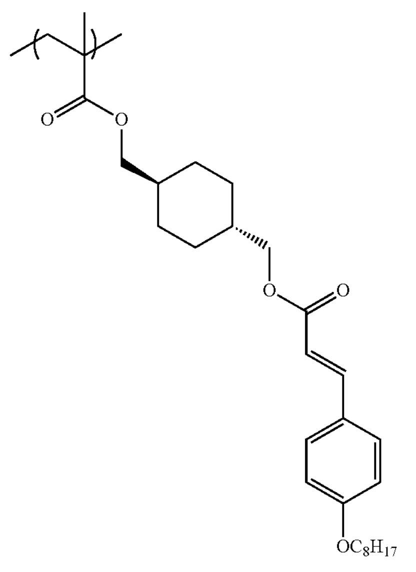
A-26
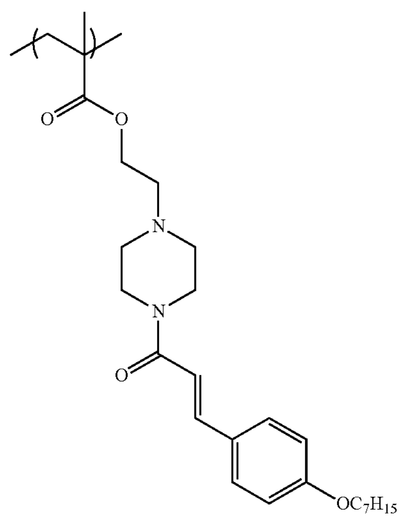
-continued
A-27
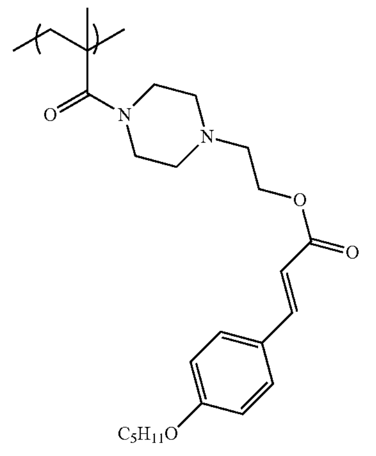
A-28
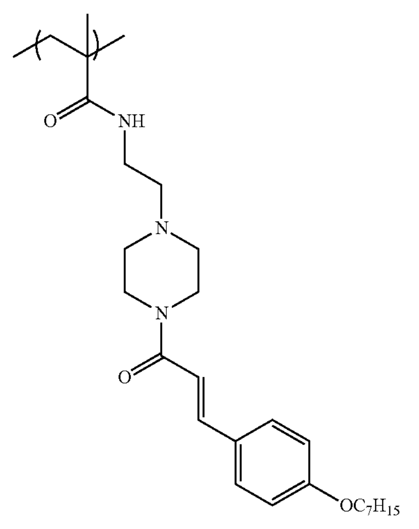
A-29
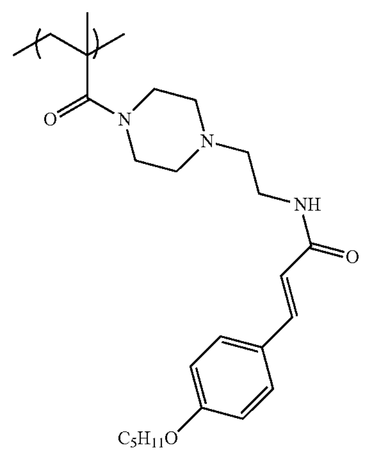

-continued

A-30

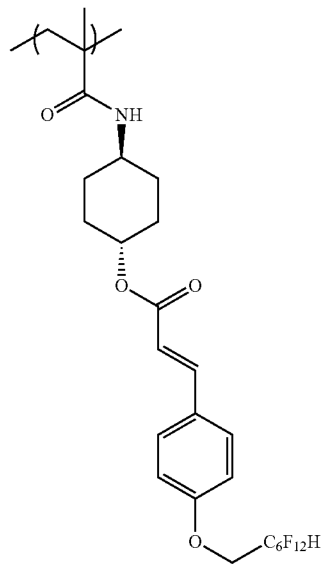

For the reason that the liquid crystal alignment properties are further improved, the content of the repeating unit A is preferably 5% to 50% by mass, and more preferably 10% to 40% by mass with respect to all the repeating units of the photo-alignment polymer.

As mentioned above, the photo-alignment polymer of the present invention is a photo-alignment polymer having a fluorine atom or a silicon atom, but is preferably the photo-alignment polymer having a fluorine atom.

Here, the positions and numbers of the fluorine atom and the silicon atom of the photo-alignment polymer are not particularly limited, but it is preferable that the fluorine atom is included in a side chain structure of the photo-alignment polymer. In addition, the silicon atom is preferably included in the structure of the main chain or a side chain of the photo-alignment polymer, and more preferably included in the structure of the main chain or the side chain as a siloxane skeleton.

For the reason that the moisture-heat resistance of the optically anisotropic layer exhibiting reverse wavelength dispersibility is further improved, it is preferable that the photo-alignment polymer of the present invention has a partial structure represented by Formula (1), and it is more preferable that the photo-alignment polymer of the present invention has a group represented by Formula (2).

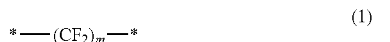

(1)

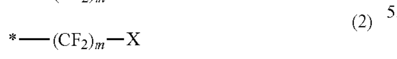

(2)

In Formulae (1) and (2), * represents a bonding position.

Moreover, in Formulae (1) and (2), m represents an integer of 2 to 20, preferably represents an integer of 3 to 12, and more preferably represents an integer of 4 to 8.

In addition, in Formula (2), X represents a hydrogen atom or a fluorine atom, and for the reason that the adhesiveness between the first optically anisotropic layer and the second optically anisotropic layer is further improved, it is preferable that X is the hydrogen atom.

For the reason that the moisture-heat resistance of the optically anisotropic layer exhibiting reverse wavelength dispersibility is further improved, it is preferable that the photo-alignment polymer of the present invention has a group represented by Formula (3).

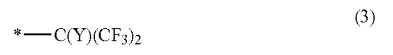

(3)

In Formula (3), * represents a bonding position, and Y represents a hydrogen atom or a substituent.

Moreover, examples of the substituent represented by one aspect of Y in (3) include a halogen atom, an alkyl group, an alkyl halide group, an alkoxy group, an aryl group, an aryloxy group, a cyano group, a carboxy group, an alkoxycarbonyl group, and a hydroxyl group.

In addition, for the reason that the moisture-heat resistance of the optically anisotropic layer exhibiting reverse wavelength dispersibility is further improved, Y in (3) is preferably an alkyl halide group, and more preferably a trifluoromethyl group ($CF_3$ group).

In the present invention, the partial structure represented by Formula (1), or the group represented by Formula (2) or Formula (3) may be in an aspect in which it is included in the above-mentioned repeating unit A, and may be in an aspect in which it is included in a repeating unit different from the above-mentioned repeating unit A.

Here, specific examples of the former aspect include an aspect in which a linear alkyl halide group having 2 to 20 carbon atoms is contained as a substituent represented by one aspect of $R^{A2}$, $R^{A3}$, $R^{A4}$, $R^{A5}$, and $R^{A6}$ in Formula (A), and more specifically include an aspect in by $R^{A2}$, $R^{A3}$, $R^{A5}$, or $R^{A6}$ in Formula (A) represents a hydrogen atom, and $R^{A4}$ in Formula (A) represents a linear alkyl halide group having 2 to 20 carbon atoms. Incidentally, examples of the linear alkyl halide group having 2 to 20 carbon atoms include examples exemplified above as the linear alkyl halide group having 1 to 20 carbon atoms, excluding the trifluoromethyl group.

On the other hand, as the latter aspect, specifically, for example, a copolymer having the above-mentioned repeating unit A and a repeating unit B including a fluoroalkyl group, which will be described later, is preferable.

The structure of the main chain of the repeating unit B including a fluoroalkyl group is not particularly limited, and examples thereof include known structures. For example, a skeleton selected from the group consisting of a (meth)acryl-based skeleton, a styrene-based skeleton, a siloxane-based skeleton, a cycloolefin-based skeleton, a methylpentene-based skeleton, an amide-based skeleton, and an aromatic ester-based skeleton is preferable.

Among those, a skeleton selected from the group consisting of the (meth)acrylic-based skeleton, the siloxane-based skeleton, and the cycloolefin-based skeleton is more preferable, and the (meth)acryl-based skeleton is still more preferable.

Examples of the repeating unit B including a fluoroalkyl group include a repeating unit represented by Formula (B-1) or (B-2).

(B-1)

(B-2)

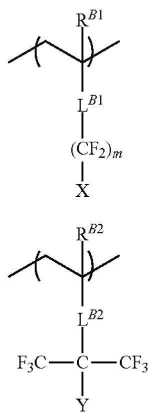

In Formulae (B-1) and (B-2), $R^{B1}$ and $R^{B2}$ each represent a hydrogen atom or a substituent.

In addition, in Formulae (B-1) and (B-2), $L^{B1}$ and $L^{B2}$ each represent a single bond or a divalent linking group.

Moreover, in Formula (B-1), X represents a hydrogen atom or a fluorine atom, and m represents an integer of 2 to 20.

In addition, in Formula (B-2), Y represents a hydrogen atom or a substituent.

In Formulae (B-1) and (B-2), $R^{B1}$ and $R^{B2}$ each represent a hydrogen atom or a substituent.

The type of the substituent represented by one aspect of $R^{B1}$ and $R^{B2}$ is not particularly limited, examples of the substituent include known substituents, and include, for example, the groups exemplified as the substituent represented by one aspect of $R^{A1}$ in Formula (A). Among those, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, the substituent represented by one aspect of $R^{B1}$ may be a group represented by $-L^{B1}-(CF_2)_m-X$, and the substituent represented by one aspect of $R^{B2}$ may be a group represented by $-L^{B2}-C(CF_3)_2-Y$. Furthermore, the definitions of $L^{B1}$, m, and X, and $L^{B2}$ and Y are the same as the definitions described in Formulae (B-1) and (B-2).

In addition, $R^{B1}$ and $R^{B2}$ preferably represent a hydrogen atom or a methyl group.

In Formulae (B-1) and (B-2), $L^{B1}$ and $L^{B2}$ each represent a single bond or a divalent linking group.

Examples of the divalent linking group represented by one aspect of $L^{B1}$ and $L^{B2}$ include the same as those exemplified as the divalent linking group represented by one aspect of $L^{A1}$ in Formula (A).

Among those, for the reason that the liquid crystal alignment properties are further improved, the divalent linking group represented by one aspect of $L^{B1}$ and $L^{B2}$ is preferably a divalent linking group formed by combination of at least two or more groups selected from the group consisting of a linear alkylene group having 1 to 10 carbon atoms, which may have a substituent (preferably a fluorine atom), a branched or cyclic alkylene group having 3 to 10 carbon atoms, which may have a substituent, an arylene group having 6 to 12 carbon atoms, which may have a substituent, —O—, —CO—, and —N(Q)- is preferable. Q represents a hydrogen atom or a substituent.

The definition of each group is the same as the definition of each group described with respect to the divalent linking group represented by one aspect of $L^{A1}$ in Formula (A).

In Formula (B-1), X represents a hydrogen atom or a fluorine atom, and for the reason that the adhesiveness between the first optically anisotropic layer and the second optically anisotropic layer is further improved, it is preferable that X is the hydrogen atom.

In Formula (B-1), m represents an integer of 2 to 20, preferably represents an integer of 3 to 12, and more preferably represents an integer of 4 to 8.

In Formula (B-2), Y represents a hydrogen atom or a substituent.

Here, examples of the substituent represented by one aspect of Y in (B-2) include the same as those described in Formula (3) above, and among those, for the reason that the moisture-heat resistance of the optically anisotropic layer exhibiting reverse wavelength dispersibility is further improved, the alkyl halide group is preferable, and a trifluoromethyl group ($CF_3$ group) is more preferable.

Specific examples of the repeating unit B including a fluoroalkyl group include repeating units represented by Formulae B-1 to B-10.

B-1

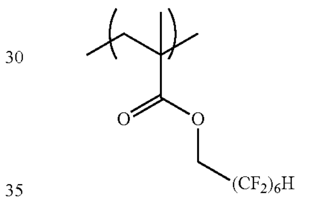

B-2

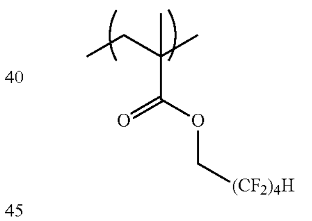

B-3

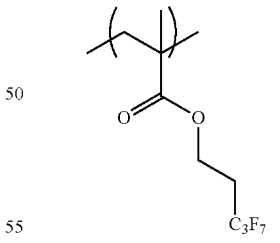

B-4

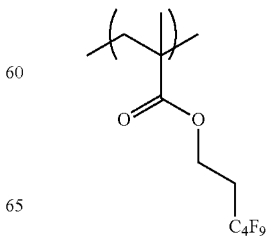

-continued

B-5

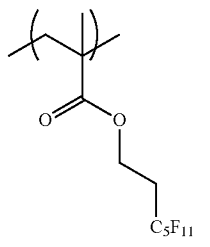

B-6

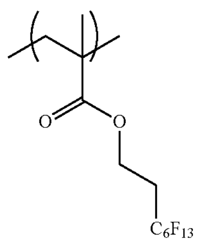

B-7

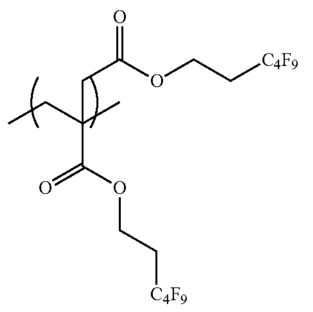

B-8

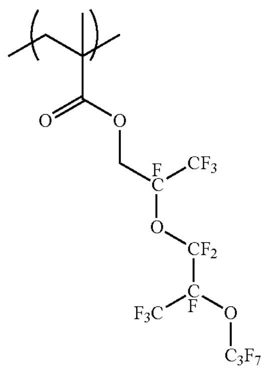

B-9

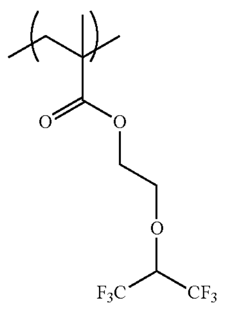

-continued

B-10

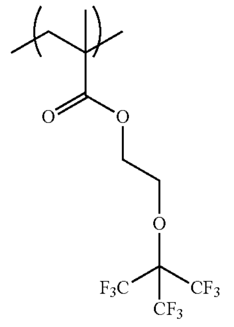

The content of the repeating unit B in the photo-alignment polymer of the present invention is not particularly limited, and for the reason that both of good liquid crystal alignment properties and a reduction in film thickness unevenness of the second optically anisotropic layer can be achieved, the content is preferably 5% to 70% by mass, and more preferably 10% to 60% by mass with respect to all the repeating units of the photo-alignment polymer.

The photo-alignment polymer of the present invention is preferably a copolymer having a repeating unit C including a crosslinkable group for the reason that the liquid crystal alignment properties are further improved by the effect of suppressing the relaxation of the alignment by improving the solvent resistance.

The type of the crosslinkable group is not particularly limited, and examples thereof include known crosslinkable groups. Among those, a cationically polymerizable group or a radically polymerizable group is preferable from the viewpoint that the adhesiveness to an upper layer disposed on the binder layer is excellent.

Examples of the cationically polymerizable group include an epoxy group, an epoxycyclohexyl group, and an oxetanyl group.

Examples of the radically polymerizable group include an acryloyl group, a methacryloyl group, a vinyl group, a styryl group, and an allyl group.

The structure of the main chain of the repeating unit C including the crosslinkable group is not particularly limited, and examples thereof include known structures. For example, a skeleton selected from the group consisting of a (meth)acryl-based skeleton, a styrene-based skeleton, a siloxane-based skeleton, a cycloolefin-based skeleton, a methylpentene-based skeleton, an amide-based skeleton, and an aromatic ester-based skeleton is preferable.

Among those, a skeleton selected from the group consisting of the (meth)acrylic-based skeleton, the siloxane-based skeleton, and the cycloolefin-based skeleton is more preferable, and the (meth)acryl-based skeleton is still more preferable.

Specific examples of the repeating unit C including a crosslinkable group include repeating units represented by Formulae C-1 to C-8.

-continued

C-1

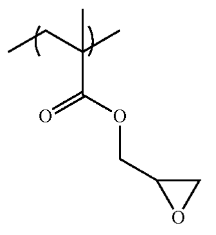

C-2

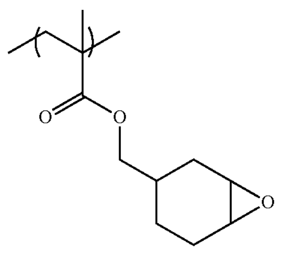

C-3

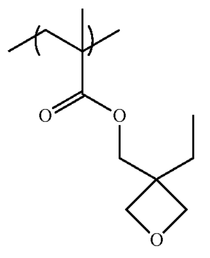

C-4

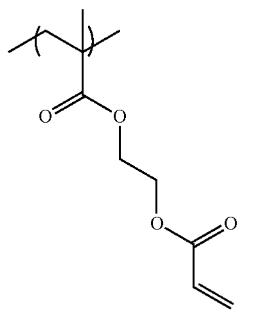

C-5

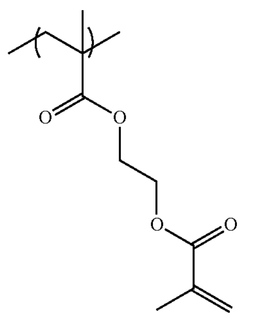

C-6

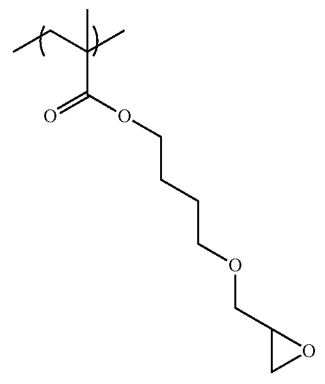

C-7

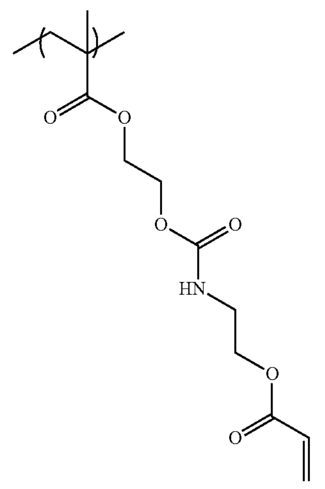

C-8

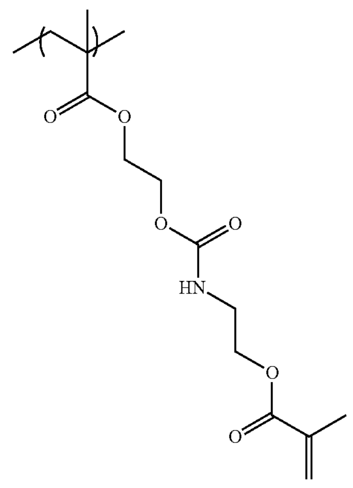

The content of any repeating unit C in the photo-alignment polymer of the present invention is not particularly limited, and for the reason that the liquid crystal alignment properties are further improved, the content of the repeating unit A is preferably 10% to 90% by mass, and more preferably 20% to 80% by mass with respect to all the repeating units of the photo-alignment polymer.

The photo-alignment polymer of the present invention may have other repeating units other than those described above.

Examples of a monomer (radically polymerizable monomer) that forms other repeating units other than those described above include an acrylic acid ester compound, a methacrylic acid ester compound, a maleimide compound, an acrylamide compound, an acrylonitrile, a maleic acid anhydride, a styrene compound, and a vinyl compound.

A method for synthesizing the photo-alignment polymer according to the embodiment of the present invention is not particularly limited, and the photo-alignment polymer can be synthesized, for example, by mixing a monomer forming the above-mentioned repeating unit A, a monomer forming the above-mentioned repeating unit B, a monomer forming any of the above-mentioned repeating unit C, and monomers forming any other repeating units, and polymerizing the mixture in an organic solvent using a radical polymerization initiator.

The weight-average molecular weight (Mw) of the photo-alignment polymer of the present invention is not particularly limited, and is preferably 10,000 to 500,000, more preferably 10,000 to 300,000, and still more preferably 30,000 to 150,000 for the reason that the liquid crystal alignment properties are further improved.

Here, the weight-average molecular weight and the number-average molecular weight in the present invention are values measured by a gel permeation chromatography (GPC) method under the following conditions.

Solvent (eluent): Tetrahydrofuran (THF)

Device name: TOSOH HLC-8320GPC

Columns: Three columns of TOSOH TSKgel Super HZM-H (4.6 mm×15 cm) linked to each other are used Column temperature: 40° C.

Sample concentration: 0.1% by mass

Flow rate: 1.0 ml/min

Calibration curve: Calibration curve obtained from 7 samples of TSK standard polystyrene Mw of 2,800,000 to 1,050 (Mw/Mn=1.03 to 1.06) manufactured by Tosoh Corporation is used <Liquid Crystal Composition>

The second optically anisotropic layer having the photo-alignment polymer of the present invention on the surface layer A is an optically anisotropic layer consisting of a liquid crystal layer.

Therefore, the second optically anisotropic layer is preferably formed, for example, using a liquid crystal composition containing the above-mentioned photo-alignment polymer and liquid crystal compound (hereinafter also simply referred to as a "composition for forming an optically anisotropic layer").

(Liquid Crystal Compound)

The liquid crystal compound contained in the composition for forming an optically anisotropic layer is a liquid crystal compound having a polymerizable group.

In general, the liquid crystal compounds can be classified into rod-like type ones and disk-like type ones according to the shapes thereof. Each of the types can further be classified into a low-molecular-weight type and a high-molecular-weight type. The term, high-molecular-weight, generally refers to having a degree of polymerization of 100 or more (Polymer PhysicsPhase Transition Dynamics, by Masao Doi, page 2, published by Iwanami Shoten, Publishers, 1992).

In the present invention, any of liquid crystal compounds can be used, but a rod-shaped liquid crystal compound or a discotic liquid crystal compound (disk-shaped liquid crystal compound) is preferably used, and the rod-shaped liquid crystal compound is more preferably used.

In the present invention, a liquid crystal compound having a polymerizable group is used in order to immobilize the above-mentioned liquid crystal compound, but it is more preferable that the liquid crystal compound has two or more polymerizable groups in one molecule. Moreover, in a case where the liquid crystal compound is a mixture of two or more kinds thereof, it is preferable that at least one kind of the liquid crystal compounds has two or more polymerizable groups in one molecule. Furthermore, after the liquid crystal compound is immobilized by polymerization, it is no longer necessary to exhibit liquid crystallinity.

In addition, a type of the polymerizable group is not particularly limited, and the polymerizable group is preferably a functional group capable of an addition polymerization reaction, and is also preferably a polymerizable ethylenically unsaturated group or a ring polymerizable group. More specifically, preferred examples of the polymerizable group include a (meth)acryloyl group, a vinyl group, a styryl group, and an allyl group, and the (meth)acryloyl group is more preferable. Moreover, the (meth)acryloyl group is a notation meaning a methacryloyl group or an acryloyl group.

As the rod-like liquid crystal compound, for example, the rod-like liquid crystal compounds described in claim 1 of JP1999-513019A (JP-H11-513019A) or paragraphs [0026] to [0098] of JP2005-289980A can be preferably used, and as the discotic liquid crystal compound, for example, the discotic liquid crystal compounds described in paragraphs [0020] to [0067] of JP2007-108732A and paragraphs [0013] to [0108] of JP2010-244038A can be preferably used, but the rod-like liquid crystal compounds and the discotic liquid crystal compounds are not limited thereto.

In the present invention, for the reason that the moisture-heat resistance of the optically anisotropic layer exhibiting reverse wavelength dispersibility is more improved and the light resistance of the optical laminate is also improved, it is preferable that at least one of the second optically anisotropic layer or a first optically anisotropic layer which will be described later, in particular, the optically anisotropic layer exhibiting reverse wavelength dispersibility among the second optically anisotropic layer and the first optically anisotropic layer which will be described later is an optically anisotropic layer in which the alignment of liquid crystal compounds having any of aromatic rings selected from the group consisting of groups represented by Formulae (Ar-1) to (Ar-7) is immobilized.

Therefore, it is preferable that the liquid crystal compound contained in the liquid crystal composition forming an optically anisotropic layer exhibiting reverse wavelength dispersibility among the second optically anisotropic layer and the first optically anisotropic layer which will be described later is a liquid crystal compound having any of aromatic rings selected from the group consisting of groups represented by Formulae (Ar-1) to (Ar-7).

(Ar-1)

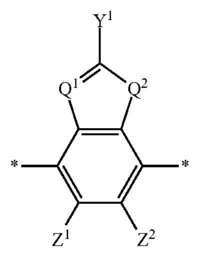

-continued (Ar-2)

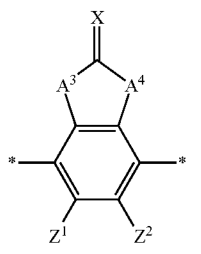

(Ar-3)

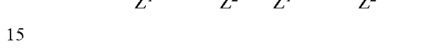

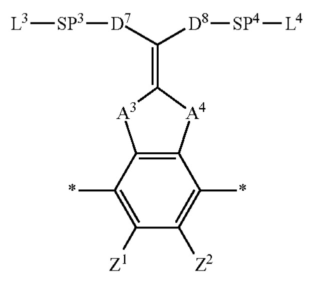

(Ar-4)

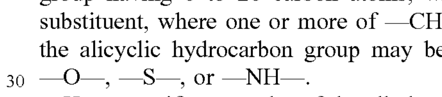

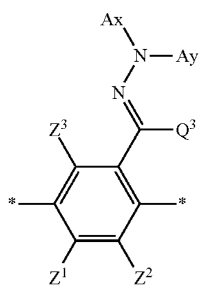

(Ar-5)

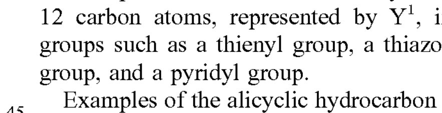

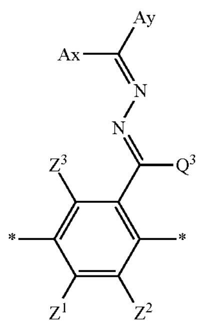

(Ar-6)

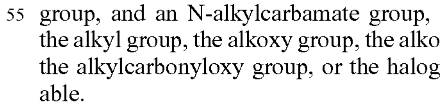

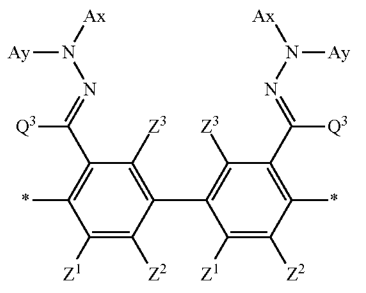

-continued (Ar-7)

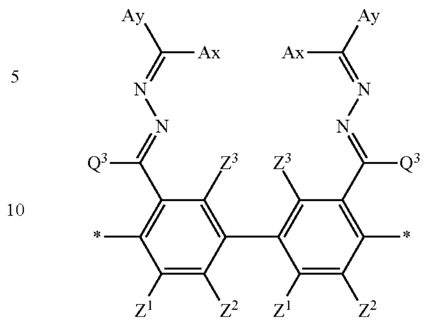

In Formulae (Ar-1) to (Ar-7), * represents a bonding position, that is, a bonding position to a portion other than the aromatic ring included in the liquid crystal compound.

In addition, in Formula (Ar-1), $Q^1$ represents N or CH, $Q^2$ represents —S—, —O—, or —N($R^6$)—, $R^6$ represents a hydrogen atom or an alkyl group having 1 to 6 carbon atoms, and $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, where one or more of —$CH_2$—'s constituting the alicyclic hydrocarbon group may be substituted with —O—, —S—, or —NH—.

Here, specific examples of the alkyl group having 1 to 6 carbon atoms, represented by $R^6$, include a methyl group, an ethyl group, a propyl group, an isopropyl group, an n-butyl group, an isobutyl group, a sec-butyl group, a tert-butyl group, an n-pentyl group, and an n-hexyl group.

In addition, examples of the aromatic hydrocarbon group having 6 to 12 carbon atoms, represented by $Y^1$, include aryl groups such as a phenyl group, a 2,6-diethylphenyl group, and a naphthyl group.

Examples of the aromatic heterocyclic group having 3 to 12 carbon atoms, represented by $Y^1$, include heteroaryl groups such as a thienyl group, a thiazolyl group, a furyl group, and a pyridyl group.

Examples of the alicyclic hydrocarbon group having 6 to 20 carbon atoms, represented by V, include a cyclohexylene group, a cyclopentylene group, a norbornylene group, and an adamantylene group.

Examples of a substituent which may be contained in $Y^1$ include an alkyl group, an alkoxy group, an alkylcarbonyl group, an alkoxycarbonyl group, an alkylcarbonyloxy group, an alkylamino group, a dialkylamino group, an alkylamide group, an alkenyl group, an alkynyl group, a halogen atom, a cyano group, a nitro group, an alkylthiol group, and an N-alkylcarbamate group, and among these, the alkyl group, the alkoxy group, the alkoxycarbonyl group, the alkylcarbonyloxy group, or the halogen atom is preferable.

As the alkyl group, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the alkoxycarbonyl group include a group in which an oxycarbonyl group (—O—CO— group) is bonded to the alkyl group exemplified above, and among these, the alkoxycarbonyl group is preferably a methoxycarbonyl group, an ethoxycarbonyl group, an n-propoxycarbonyl group, or an isopropoxycarbonyl group, and more preferably the methoxycarbonyl group.

Examples of the alkylcarbonyloxy group include a group in which a carbonyloxy group (—CO—O— group) is bonded to the alkyl group exemplified above, and among these, the alkylcarbonyloxy group is preferably a methylcarbonyloxy group, an ethylcarbonyloxy group, an n-propylcarbonyloxy group, or an isopropylcarbonyloxy group, and more preferably the methylcarbonyloxy group.

Examples of the halogen atom include a fluorine atom, a chlorine atom, a bromine atom, and an iodine atom, and among these, the fluorine atom or the chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, $—OR^7$, $—NR^8R^9$, $—SR^{10}$, $—COOR^{11}$, or $—COR^{12}$, where $R^7$ to $R^{12}$ each independently represent a hydrogen atom or an alkyl group having 1 to 6 carbon atoms, and $Z^1$ and $Z^2$ may be bonded to each other to form an aromatic ring.

Here, as the monovalent aliphatic hydrocarbon group having 1 to 20 carbon atoms, an alkyl group having 1 to 15 carbon atoms is preferable, an alkyl group having 1 to 8 carbon atoms is more preferable, and specifically a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[$5.2.1.0^{2,6}$]decyl group, a tricyclo[$3.3.1.1^{3,7}$]decyl group, a tetracyclo[$6.2.1.1^{3,6}.0^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Specific examples of the monovalent aromatic heterocyclic group having 6 to 20 carbon atoms include a 4-pyridyl group, a 2-furyl group, a 2-thienyl group, a 2-pyrimidinyl group, and a 2-benzothiazolyl group.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms, represented by each of $R^7$ to $R^{10}$, include a methyl group, an ethyl group, a propyl group, an isopropyl group, an n-butyl group, an isobutyl group, a sec-butyl group, a tert-butyl group, an n-pentyl group, and an n-hexyl group.

In addition, as described above, $Z^1$ and $Z^2$ may be bonded to each other to form an aromatic ring, and examples of the structure in a case where $Z^1$ and $Z^2$ in Formula (Ar-1) are bonded to each other to form an aromatic ring include a group represented by Formula (Ar-1a). Furthermore, in Formula (Ar-1a), * represents a bonding position, and examples of $Q^1$, $Q^2$, and $Y^1$ include the same ones as those described in Formula (Ar-1).

(Ar-1a)

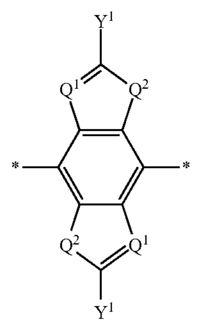

In addition, in Formulae (Ar-2) and (Ar-3), $A^3$ and $A^4$ each independently represent a group selected from the group consisting of —O—, $—N(R^{13})—$, —S—, and —CO—, where $R^{13}$ represents a hydrogen atom or a substituent.

Examples of the substituent represented by $R^{13}$ include the same ones as the substituents which may be contained in $Y^1$ in Formula (Ar-1).

In addition, in Formula (Ar-2), X represents a hydrogen atom or a non-metal atom of Groups XIV to XVI, to which a substituent may be bonded.

Examples of the non-metal atom of Groups XIV to XVI represented by X include an oxygen atom, a sulfur atom, a nitrogen atom, to which a hydrogen atom or a substituent is bonded [$=N—R^{N1}$, $R^{N1}$ represents a hydrogen atom or a substituent], and a carbon atom, to which a hydrogen atom or a substituent is bonded [$=C—(R^{C1})_2$, $R^{C1}$ represents a hydrogen atom or a substituent].

Examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $D^7$ and $D^8$ each independently represent a single bond, —CO—, —O—, —S—, —C(=S)—, $—CR^1R^2—$, $—CR^3=CR^4—$, $—NR^5—$, or a divalent linking group consisting of a combination of two or more of these groups, where $R^1$ to $R^5$ each independently represent a hydrogen atom, a fluorine atom, or an alkyl group having 1 to 12 carbon atoms.

Here, examples of the divalent linking group represented by one aspect of $D^7$ and $D^8$ include —CO—, —O—, —CO—O—, —C(═S)O—, —$CR^1R^2$—, —$CR^1R^2$—$CR^1R^2$—, —O—$CR^1R^2$—, —$CR^1R^2$—O—$CR^1R^2$—, —CO—O—$CR^1R^2$—, —O—CO—$CR^1R^2$—, —$CR^1R^2$—O—CO—$CR^1R^2$—, —$CR^1R^2$—CO—O—$CR^1R^2$—, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

Among these, any of —CO—, —O—, and —CO—O— is preferable.

In addition, in Formula (Ar-3), $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with O, S, NH, N(Q)-, or —CO—, where Q represents a substituent. Examples of the substituent include the same ones as the substituents which may be contained in $Y^1$ in Formula (Ar-1).

Here, suitable examples of the linear or branched alkylene group having 1 to 12 carbon atoms, represented by one aspect of $SP^3$ and $SP^4$, include a methylene group, an ethylene group, a propylene group, a butylene group, a pentylene group, a hexylene group, a methylhexylene group, and a heptylene group. Furthermore, $SP^1$ and $SP^2$ may be a divalent linking group in which one or more of —$CH_2$—'s constituting the linear or branched alkylene group having 1 to 12 carbon atoms are substituted with —O—, —S—, —NH—, —N(Q)-, or —CO—, and examples of the substituent represented by Q include the same ones as those of the substituent which may be contained in each of $Y^1$ in Formula (Ar-1).

Moreover, in Formula (Ar-3), $L^3$ and $L^4$ each independently represent a monovalent organic group.

Moreover, in Formulae (Ar-4) to (Ar-7), Ax represents an organic group having 2 to 30 carbon atoms, which has at least one aromatic ring selected from the group consisting of an aromatic hydrocarbon ring and an aromatic heterocyclic ring.

In addition, in Formulae (Ar-4) to (Ar-7), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of each of Ax and Ay include the ones described in paragraphs [0039] to of WO2014/010325A.

In addition, specific examples of the alkyl group having 1 to 20 carbon atoms, represented by $Q^3$, include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as those of the substituent which may be contained in $Y^1$ in Formula (Ar-1).

In the present invention, it is preferable that the liquid crystal compound is a compound represented by Formula (I) for the reason that the alignment can be performed at a relatively low temperature. Furthermore, in Formula (I), Ar represents any of aromatic rings selected from the group consisting of the groups represented by Formulae (Ar-1) to (Ar-7) mentioned above. It should be noted that in a case where q1 in Formula (I) is 2, a plurality of Ar's may be the same as or different from each other.

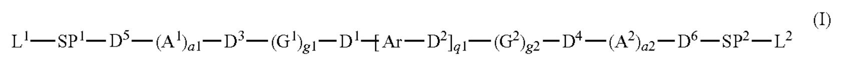

(I)

Examples of the monovalent organic group represented by each of $L^3$ and $L^4$ include an alkyl group, an aryl group, and a heteroaryl group.

The alkyl group may be linear, branched, or cyclic, but is preferably linear. The number of carbon atoms of the alkyl group is preferably 1 to 30, more preferably 1 to 20, and still more preferably 1 to 10.

Further, the aryl group may be a monocycle or a polycycle, but is preferably the monocycle. The number of carbon atoms of the aryl group is preferably 6 to 25, and more preferably 6 to 10.

In addition, the heteroaryl group may be a monocycle or a polycycle. The number of heteroatoms constituting the heteroaryl group is preferably 1 to 3. The heteroatom constituting the heteroaryl group is preferably a nitrogen atom, a sulfur atom, or an oxygen atom. The number of carbon atoms of the heteroaryl group is preferably 6 to 18, and more preferably 6 to 12.

In addition, the alkyl group, the aryl group, and the heteroaryl group may be unsubstituted or have a substituent. Examples of the substituent include the same ones as the substituents which may be contained in $Y^1$ in General Formula (Ar-1).

In Formula (I), a1, a2, g1, and g2 each independently represent 0 or 1. It should be noted that at least one of a1 or g1 represents 1, and at least one of a2 or g2 represents 1.

In addition, in Formula (I), q1 represents 1 or 2.

Moreover, in Formula (I), $D^1$, $D^2$, $D^3$, $D^4$, $D^5$, and $D^6$ each independently represent a single bond; —CO—, —O—, —S—, —C(═S), —$CR^1R^2$—, —$CR^3$═$CR^4$—, —$NR^5$—, or a divalent linking group consisting of a combination of two or more of these groups, and $R^1$ to $R^5$ each independently represent a hydrogen atom, a fluorine atom, or an alkyl group having 1 to 12 carbon atoms. It should be noted that in a case where q1 is 2, a plurality of $D^2$'s may be the same as or different from each other.

In addition, in Formula (I), $G^1$ and $G^2$ each independently represent an aromatic ring having 6 to 20 carbon atoms, which may have a substituent, or a divalent alicyclic hydrocarbon group having 5 to 20 carbon atoms, which may have a substituent, where one or more of —$CH_2$—'s constituting the alicyclic hydrocarbon group may be substituted with —O—, —S—, or —NH—.

In addition, in Formula (I), $A^1$ and $A^2$ each independently represent an aromatic ring having 6 to 20 carbon atoms, which may have a substituent, or a divalent alicyclic hydrocarbon group having 5 to 20 carbon atoms, which may have a substituent, where one or more of —$CH_2$—'s constituting the alicyclic hydrocarbon group may be substituted with —O—, —S—, or —NH—.

Furthermore, in Formula (I), $SP^1$ and $SP^2$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, where Q represents a substituent.

In addition, in Formula (I), $L^1$ and $L^2$ each independently represent a monovalent organic group, and at least one of $L^1$ or $L^2$ represents a polymerizable group. It should be noted that in a case where Ar is the aromatic ring represented by Formula (Ar-3) mentioned above, at least one of $L^1$ or $L^2$, or $L^3$ or $L^4$ in Formula (Ar-3) mentioned above represents a polymerizable group.

In Formula (I), it is preferable that all of a1, a2, g1 and g2 are 1.

In Formula (I), q1 is preferably 1.

In Formula (I), examples of the divalent linking group represented by one aspect of $D^1$, $D^2$, $D^3$, $D^4$, $D^5$, and $D^6$ include the same ones as those described in $D^7$ and $D^8$ in Formula (Ar-3).

Among these, any of —CO—, —O—, and —CO—O— is preferable.

In Formula (I), examples of the aromatic ring having 6 to 20 carbon atoms, represented by one aspect of G1 and $G^2$, include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring, and among these, the benzene ring (for example, a 1,4-phenyl group) is preferable.

In Formula (I), the divalent alicyclic hydrocarbon group having 5 to 20 carbon atoms, shown in one aspect of $G^1$ and $G^2$, is preferably a 5- or 6-membered ring. In addition, the alicyclic hydrocarbon group may be saturated or unsaturated, but is preferably a saturated alicyclic hydrocarbon group. With regard to the divalent alicyclic hydrocarbon group represented by each of $G^1$ and $G^2$, reference can be made to, for example, the description in paragraph [0078] of JP2012-21068A, the contents of which are hereby incorporated by reference.

In the present invention, $G^1$ and $G^2$ in Formula (I) are each preferably a cycloalkane ring.

Specific examples of the cycloalkane ring include a cyclohexane ring, a cyclopeptane ring, a cyclooctane ring, a cyclododecane ring, and a cyclodocosane ring.

Among those, the cyclohexane ring is preferable, a 1,4-cyclohexylene group is more preferable, and a trans-1,4-cyclohexylene group is still more preferable.

Moreover, in Formula (I), examples of the substituent which may be contained in the aromatic ring having 6 to 20 carbon atoms or the divalent alicyclic hydrocarbon group having 5 to 20 carbon atoms in $G^1$ and $G^2$ include the same ones as the substituents which may be contained in $Y^1$ in Formula (Ar-1).

In Formula (I), examples of the aromatic ring having 6 to 20 or more carbon atoms, shown in one aspect of $A^1$ and $A^2$, include the same ones as those described in $G^1$ and $G^2$ in Formula (I).

In addition, in Formula (I), examples of the divalent alicyclic hydrocarbon group having 5 to 20 carbon atoms, shown in one aspect of $A^1$ and $A^2$, include the same ones as those described in $G^1$ and $G^2$ in Formula (I).

Moreover, in $A^1$ and $A^2$, examples of the substituent which may be contained in the aromatic ring having 6 to 20 carbon atoms or the divalent alicyclic hydrocarbon group having 5 to 20 carbon atoms include the same ones as those of the substituent which may be contained in $Y^1$ in Formula (Ar-1).

In Formula (I), examples of the linear or branched alkylene group having 1 to 12 carbon atoms, represented by one aspect of SP' and $SP^2$, include the same ones as those described in $SP^3$ and $SP^4$ in Formula (Ar-3).

In Formula (I), examples of the monovalent organic group represented by each of $L^1$ and $L^2$ include the same ones as those described in $L^3$ and $L^4$ in Formula (Ar-3).

In Formula (I), the polymerizable group represented by at least one of $L^1$ or $L^2$ is not particularly limited, but is preferably a polymerizable group which is radically polymerizable or cationically polymerizable.

A known radically polymerizable group can be used as the radically polymerizable group, and suitable examples thereof include an acryloyloxy group or a methacryloyloxy group. In this case, it is known that the acryloyloxy group generally has a high polymerization rate, and from the viewpoint of improvement of productivity, the acryloyloxy group is preferable but the methacryloyloxy group can also be used as the polymerizable group.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is suitable, and an epoxy group, an oxetanyl group, or the vinyloxy group is particularly preferable.

Particularly preferred examples of the polymerizable group include a polymerizable group represented by any of Formulae (P-1) to (P-20).

(P-1)

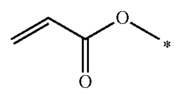

(P-2)

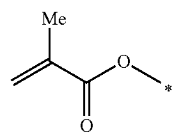

(P-3)

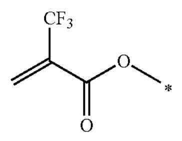

(P-4)

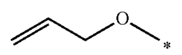

(P-5)

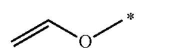

(P-6)

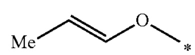

(P-7)

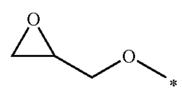

-continued (P-8)

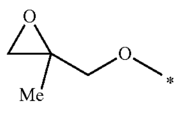

(P-9)

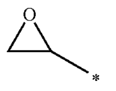

(P-10)

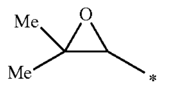

(P-11)

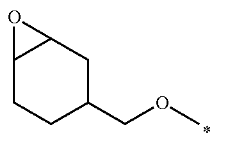

(P-12)

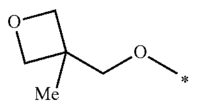

(P-13)

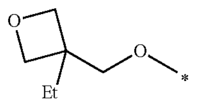

(P-14)

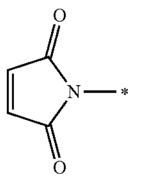

(P-15)

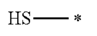

(P-16)

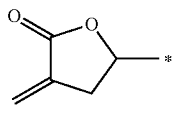

(P-17)

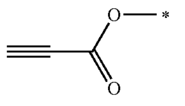

-continued (P-18)

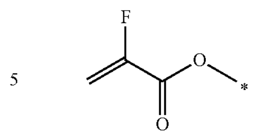

(P-19)

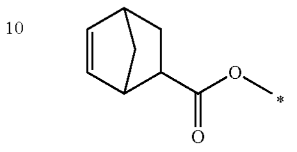

(P-20)

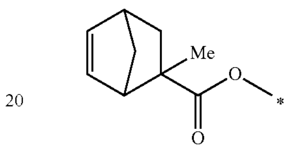

For the reason that the durability is good, either of $L^1$ and $L^2$ in Formula (I) is preferably a polymerizable group, and more preferably an acryloyloxy group or a methacryloyloxy group in Formula (I).

Examples of the compound represented by Formula (I) include the compounds represented by General Formula (1) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (1) described in JP2016-081035A (in particular, the compounds described in paragraph Nos. [0043] to [0055]).

Moreover, suitable examples of the compound represented by Formula (I) include compounds represented by Formulae (1) to (22), and specific examples thereof include the compounds having side chain structures shown in Tables 1 to 3 below as K (side chain structure) in Formulae (1) to (22).

Furthermore, in Tables 1 to 3 below, "*" shown in the side chain structure of K represents a bonding position to an aromatic ring.

In addition, in the side chain structures shown in 2-2 in Table 2 below and 3-2 in Table 3 below, a group adjacent to each of the acryloyloxy group and the methacryloyl group represents a propylene group (a group in which a methyl group is substituted with an ethylene group), and represents a mixture of regioisomers in which the positions of the methyl groups are different.

(1)

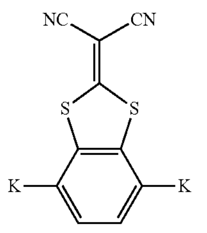

(2)

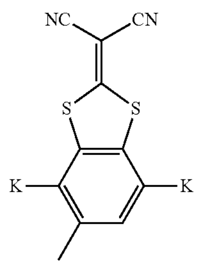

-continued
(3)
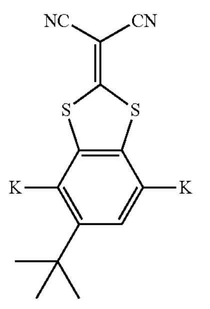
(4)
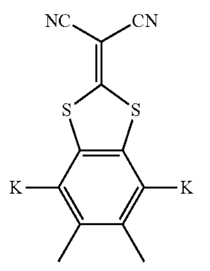
(5)
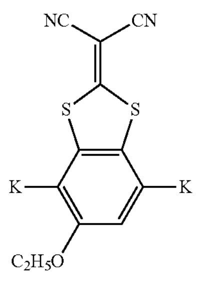
(6)
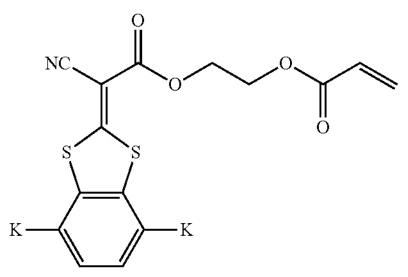
(7)
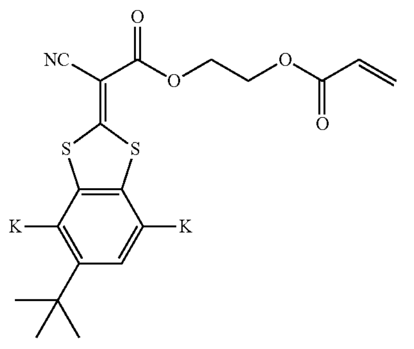
(8)
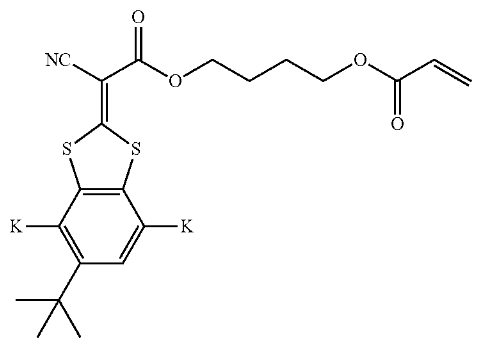
(9)
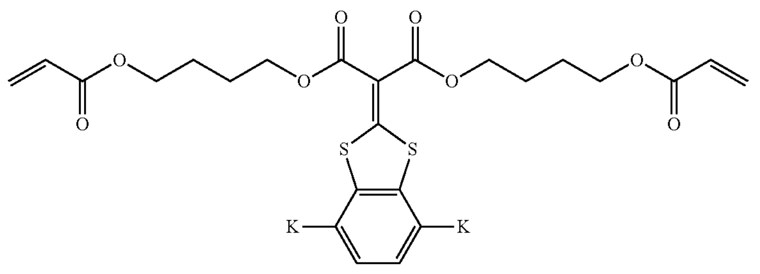
(10)
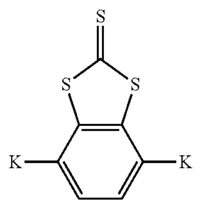
(11)
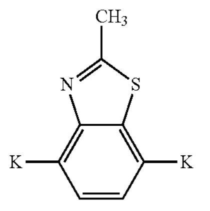

-continued
(12)
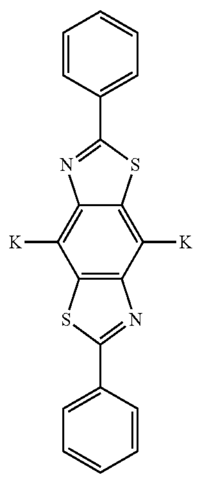
(13)
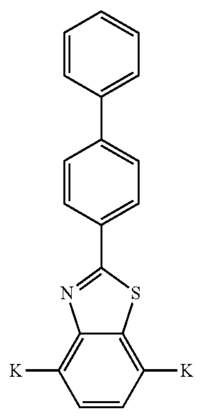
(14)
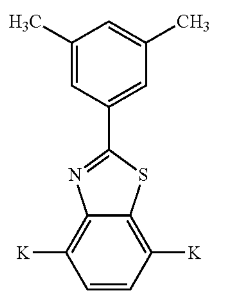
(15)
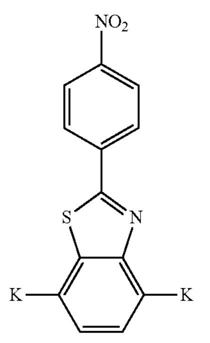
(16)
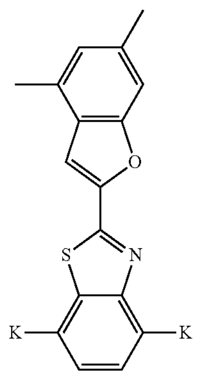
(17)
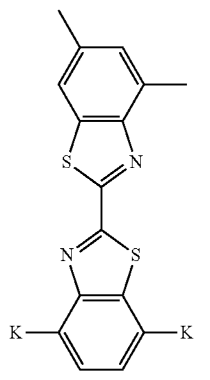
(18)
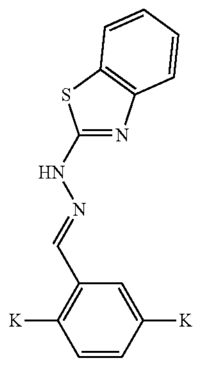
(19)
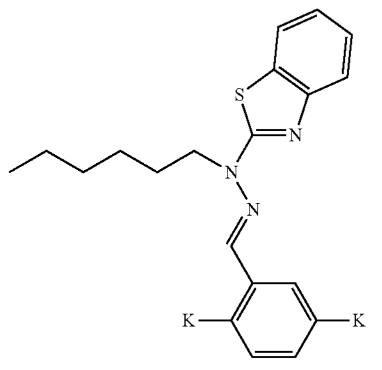

-continued
(20)
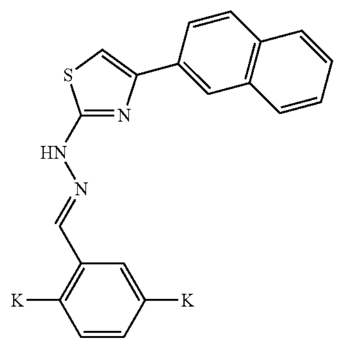
(21)
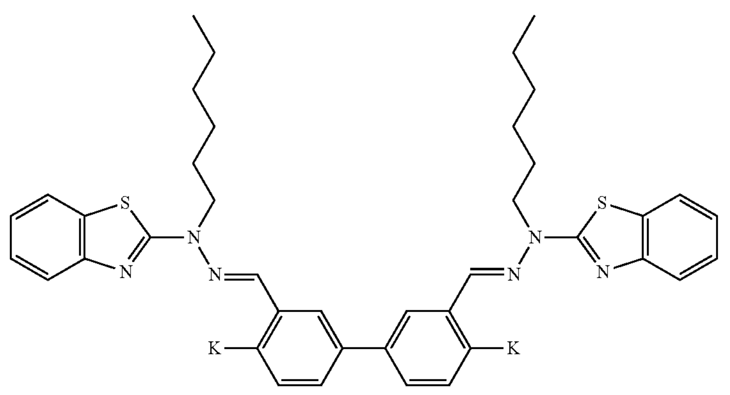
(22)
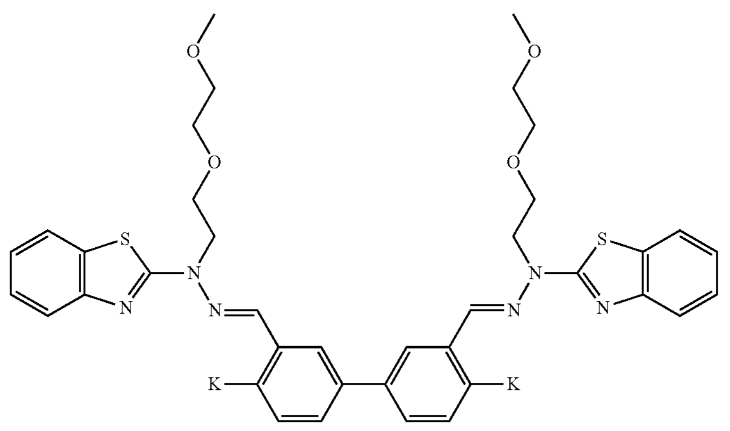
TABLE 1
| | K (side chain structure) |
|---|---|
| 1-1 | 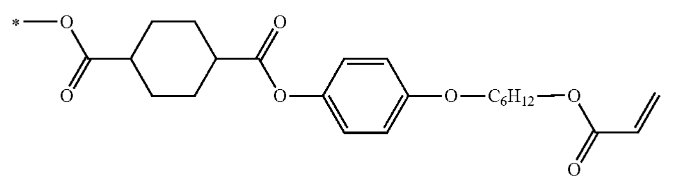 |

TABLE 1-continued
| | K (side chain structure) |
|---|---|
| 1-2 | 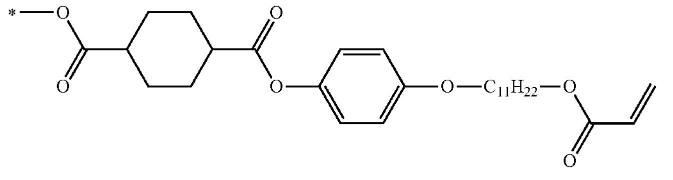 |
| 1-3 | 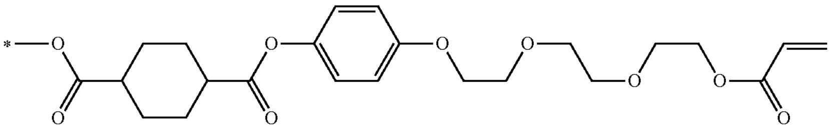 [SMILES: C=CC(=O)OCCOCCOCCOc1ccc(OC(=O)C2CCC(C(=O)OC)CC2)cc1] |
| 1-4 | 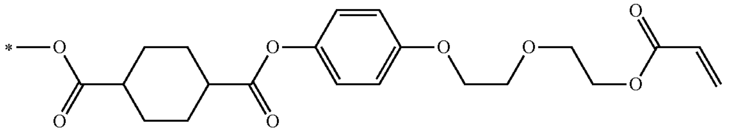 [SMILES: C=CC(=O)OCCOCCOc1ccc(OC(=O)C2CCC(C(=O)OC)CC2)cc1] |
| 1-5 | 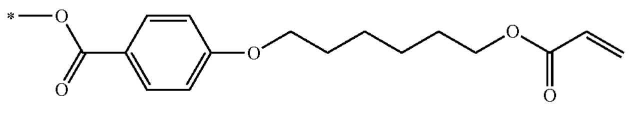 [SMILES: C=CC(=O)OCCCCCCOc1ccc(C(=O)OC)cc1] |
| 1-6 | 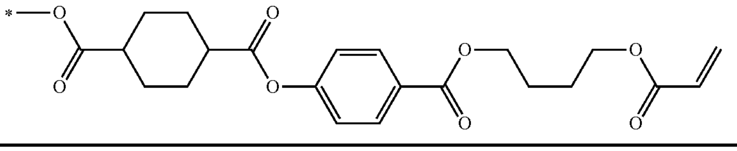 |
TABLE 2
| | K (side chain structure) |
|---|---|
| 2-1 | 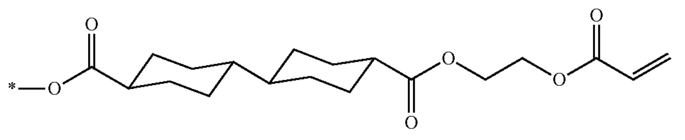 [SMILES: *OC(=O)C1CCC(C2CCC(C(=O)OCCOC(=O)C=C)CC2)CC1] |
| 2-2 | 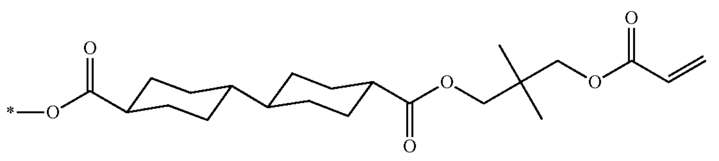 [SMILES: *OC(=O)C1CCC(C2CCC(C(=O)OCC(C)(C)COC(=O)C=C)CC2)CC1] |
| 2-3 | 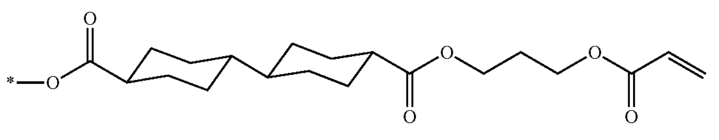 [SMILES: *OC(=O)C1CCC(C2CCC(C(=O)OCCCOC(=O)C=C)CC2)CC1] |
| 2-4 | 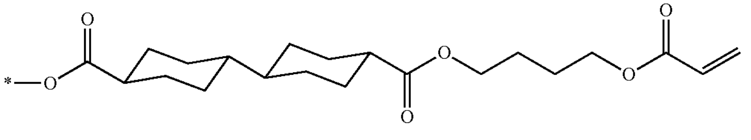 [SMILES: *OC(=O)C1CCC(C2CCC(C(=O)OCCCCOC(=O)C=C)CC2)CC1] |

TABLE 2-continued
| K (side chain structure) | |
|---|---|
| 2-5 | 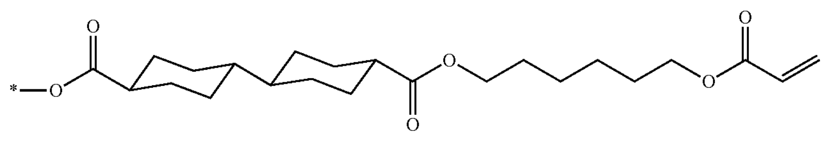 [SMILES: *OC(=O)C1CCC(C2CCC(C(=O)OCCCCCCOC(=O)C=C)CC2)CC1] |
| 2-6 | 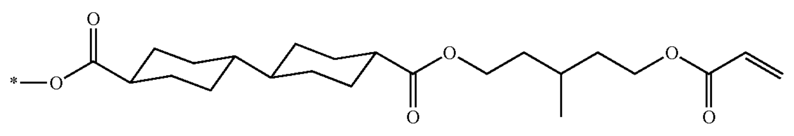 [SMILES: *OC(=O)C1CCC(C2CCC(C(=O)OCCC(C)CCOC(=O)C=C)CC2)CC1] |
| 2-7 | 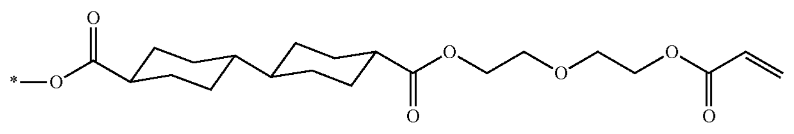 [SMILES: *OC(=O)C1CCC(C2CCC(C(=O)OCCOCCOC(=O)C=C)CC2)CC1] |
| 2-8 | 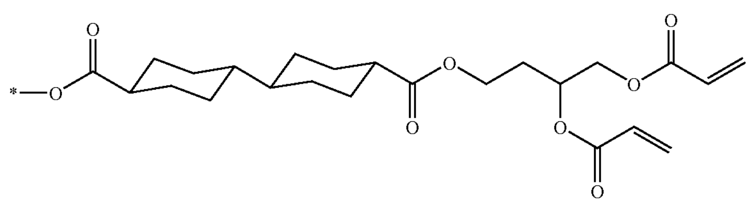 [SMILES: *OC(=O)C1CCC(C2CCC(C(=O)OCCC(COC(=O)C=C)OC(=O)C=C)CC2)CC1] |
| 2-9 | 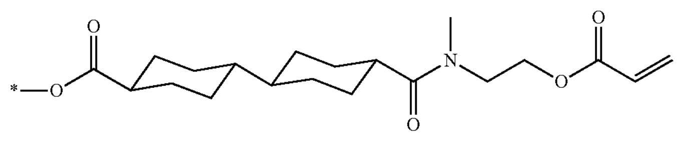 [SMILES: *OC(=O)C1CCC(C2CCC(C(=O)N(C)CCOC(=O)C=C)CC2)CC1] |
| 2-10 | 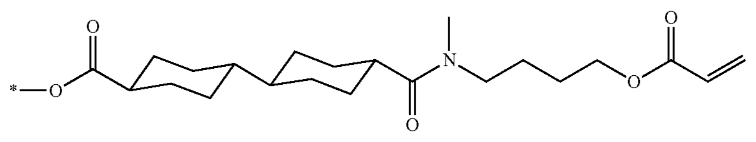 [SMILES: *OC(=O)C1CCC(C2CCC(C(=O)N(C)CCCCOC(=O)C=C)CC2)CC1] |
| 2-11 | 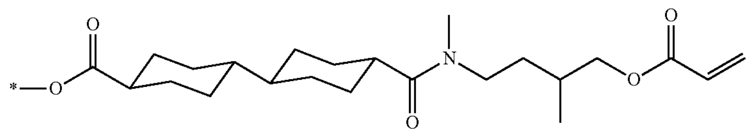 [SMILES: *OC(=O)C1CCC(C2CCC(C(=O)N(C)CCC(C)COC(=O)C=C)CC2)CC1] |
| 2-12 | 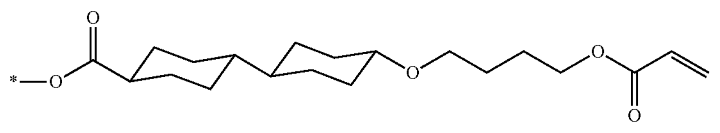 [SMILES: *OC(=O)C1CCC(C2CCC(OCCCCOC(=O)C=C)CC2)CC1] |
| 2-13 | 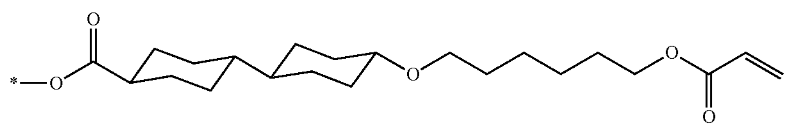 [SMILES: *OC(=O)C1CCC(C2CCC(OCCCCCCOC(=O)C=C)CC2)CC1] |
| 2-14 | 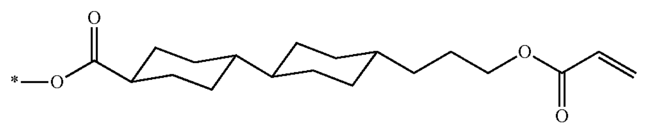 [SMILES: *OC(=O)C1CCC(C2CCC(CCCOC(=O)C=C)CC2)CC1] |

TABLE 3
| K (side chain structure) | |
|---|---|
| 3-1 | 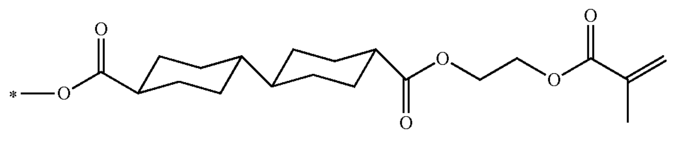 [SMILES: C=C(C)C(=O)OCCOC(=O)C1CCC(C2CCC(C(=O)OC)CC2)CC1] |
| 3-2 | 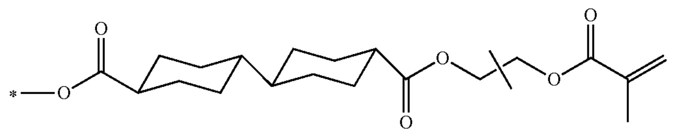 |
| 3-3 | 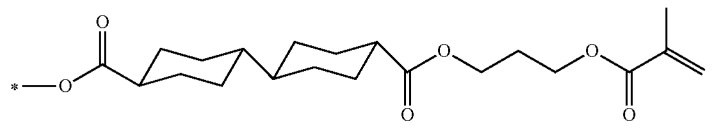 [SMILES: C=C(C)C(=O)OCCCOC(=O)C1CCC(C2CCC(C(=O)OC)CC2)CC1] |
| 3-4 | 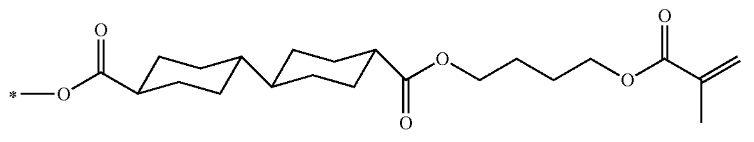 [SMILES: C=C(C)C(=O)OCCCCOC(=O)C1CCC(C2CCC(C(=O)OC)CC2)CC1] |
| 3-5 | 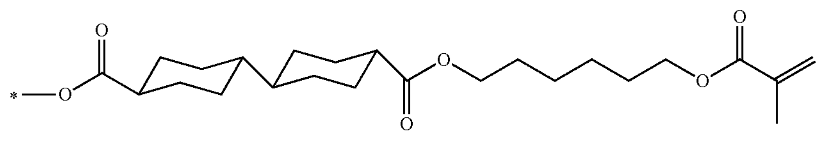 [SMILES: C=C(C)C(=O)OCCCCCCOC(=O)C1CCC(C2CCC(C(=O)OC)CC2)CC1] |
| 3-6 | 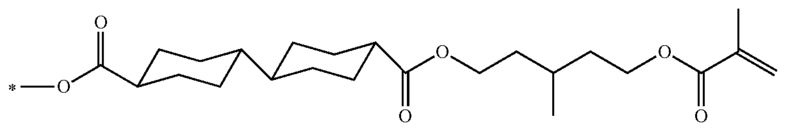 [SMILES: C=C(C)C(=O)OCCC(C)CCOC(=O)C1CCC(C2CCC(C(=O)OC)CC2)CC1] |
| 3-7 | 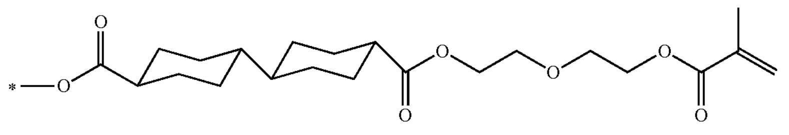 |
| 3-8 | 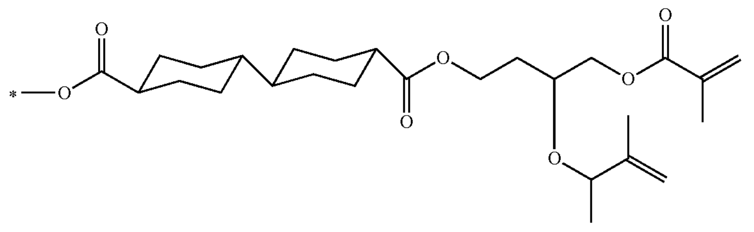 [SMILES: C=C(C)C(=O)OCC(CCOC(=O)C1CCC(C2CCC(C(=O)OC)CC2)CC1)OC(C)C(=C)C] |
| 3-9 | 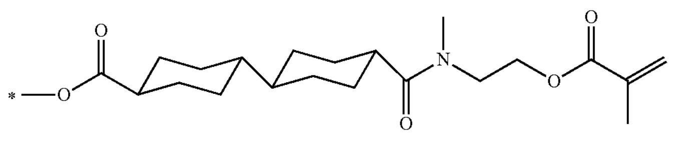 [SMILES: C=C(C)C(=O)OCCN(C)C(=O)C1CCC(C2CCC(C(=O)OC)CC2)CC1] |
| 3-10 | 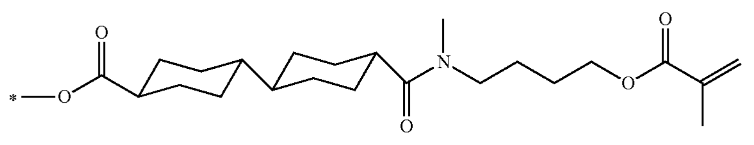 [SMILES: C=C(C)C(=O)OCCCCN(C)C(=O)C1CCC(C2CCC(C(=O)OC)CC2)CC1] |

TABLE 3-continued

| | K (side chain structure) |
|---|---|
| 3-11 | |
| 3-12 | |
| 3-13 | |
| 3-14 | |

(Polymerization Initiator)

The composition for forming an optically anisotropic layer preferably contains a polymerization initiator.

The polymerization initiator is not particularly limited, and examples thereof include a thermal polymerization initiator and a photopolymerization initiator depending on the type of the polymerization reaction.

As the polymerization initiator, a photopolymerization initiator capable of initiating a polymerization reaction upon irradiation with ultraviolet rays is preferable.

Examples of the photopolymerization initiator include α-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

(Surfactant)

From the viewpoint of suppressing the generation of cissing in a case where the liquid crystal composition for forming a first optically anisotropic layer is applied onto the second optically anisotropic layer, it is preferable that the composition for forming an optically anisotropic layer does not contain a surfactant. It should be noted that the surfactant may be used in combination within a range in which the element ratio of fluorine or silicon on a surface of the second optically anisotropic layer on a side in contact with the first optically anisotropic layer can be adjusted to 0.05% to 15.00% by atom.

As the surfactant, a surfactant having high elution properties is preferably used.

Here, a surfactant having high elution properties refers to a surfactant that in a case where a solvent is applied to a cured film containing the surfactant, at least a part of the surfactant in the cured film is eluted into the applied solvent, and suitable specific examples thereof include a surfactant having a fluorine atom or a silicon atom and having a weight-average molecular weight of 10,000 or less.

With such a surfactant having high elution properties, it is considered that the surfactant is easily extracted into the solvent at the time of forming the upper layer (first optically anisotropic layer), and as a result, an interaction between the photo-alignment group of the photo-alignment polymer present in the underlayer (second optically anisotropic layer) and the liquid crystal compound present in the upper layer is improved and the liquid crystal alignment properties are improved.

(Solvent)

From the viewpoint of workability, it is preferable that the composition for forming an optically anisotropic layer contains a solvent.

Examples of the solvent include ketones (for example, acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

The solvents may be used singly or in combination of two or more kinds thereof.

The second optically anisotropic layer contained in the optical laminate of the embodiment of the present invention is preferably a layer that is formed using the above-mentioned composition for forming an optically anisotropic layer and has alignment controllability on the surface.

More specifically, the second optically anisotropic layer can be manufactured by, for example, a production method including an applying step of applying the above-mentioned composition for forming an optically anisotropic layer onto a surface of a support, and a light irradiating step of irradiating the coating film of the composition for forming an optically anisotropic layer with polarized light or with unpolarized light from an oblique direction with respect to the coating film surface.

<Applying Step>

Examples of the support used in the applying step include a glass substrate and a polymer film.

Examples of the material for the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile styrene copolymer; polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an alignment layer may also be disposed on the support.

A thickness of the support is not particularly limited, and is preferably 5 to 200 more preferably 10 to 100 and still more preferably 20 to 90 μm.

An applying method in the applying step is not particularly limited and can be appropriately selected depending on the purposes, and examples of the method include spin coating, die coating, gravure coating, flexography, and ink jet printing.

<Light Irradiating Step>

In the light irradiating step, a polarized light with which the coating film of the composition forming an optically anisotropic layer is irradiated is not particularly limited, examples thereof include linearly polarized light, circularly polarized light, and elliptically polarized light, and the linearly polarized light is preferable.

In addition, the "oblique direction" in which the unpolarized light is irradiated is not particularly limited as long as it is a direction tilted by a polar angle θ ($0<\theta<90°$) with respect to the normal direction of the surface of the coating film, and can be suitably selected according to the purpose, and θ is preferably 20° to 80°.

A wavelength of the polarized light or the unpolarized light beam is not particularly limited as long as it can impart alignment controllability on the liquid crystal molecules to the coating film of the composition for forming an optically anisotropic layer, and examples thereof include near ultraviolet rays and visible light. Among those, near ultraviolet rays at 250 nm to 450 nm are particularly preferable.

In addition, examples of a light source for irradiating polarized light or unpolarized light include a xenon lamp, a high-pressure mercury lamp, an ultra-high-pressure mercury lamp, and a metal halide lamp. A wavelength range for irradiation can be limited by using an interference filter, a color filter, or the like with respect to ultraviolet rays or visible light obtained from such a light source. In addition, linearly polarized light can be obtained by using a polarizing filter or a polarizing prism with respect to light from these light sources.

An integrated light amount of the polarized light or the unpolarized light is not particularly limited as long as it can impart alignment controllability on the liquid crystalline molecules to the coating film from the composition for forming an optically anisotropic layer, but is preferably 1 to 300 $mJ/cm^2$, and more preferably 5 to 100 $mJ/cm^2$.

An illuminance of the polarized light or unpolarized light is not particularly limited as long as it can impart alignment controllability on the liquid crystalline molecules to the coating film from the composition for forming an optically anisotropic layer, and is, for example, preferably 0.1 to 300 $mW/cm^2$, and more preferably 1 to 100 $mW/cm^2$.

A thickness of the second optically anisotropic layer is not particularly limited, and is preferably 0.1 to 10 more preferably 0.2 to 5 and still more preferably 0.3 to 2 μm from the reason that the liquid crystal alignment properties of the first optically anisotropic layer are further improved.

[First Optically Anisotropic Layer]

The first optically anisotropic layer included in the optical laminate of the embodiment of the present invention is an optically anisotropic layer that is directly laminated on the above-mentioned second optically anisotropic layer and consists of a liquid crystal layer.

The first optically anisotropic layer is preferably formed using a liquid crystal composition including a liquid crystal compound.

Here, examples of the liquid crystal composition for forming a first optically anisotropic layer include a composition formed by blending the liquid crystal compound described in the above-mentioned composition for forming an optically anisotropic layer, a polymerization initiator, a solvent, and the like.

A thickness of the first optically anisotropic layer is not particularly limited, and is preferably 0.1 to 10 and more preferably 0.5 to 5 μm.

A thickness of the optical laminate of the embodiment of the present invention is not particularly limited, but is preferably 0.2 to 10 more preferably 0.5 to 5 and particularly preferably 1 to 4 μm.

In the optical laminate of the embodiment of the present invention, the element ratio of fluorine or silicon on the surface of the second optically anisotropic layer on the side in contact with the first optically anisotropic layer is 0.05% to 15.00% by atom as mentioned above, but from the viewpoint of a balance between the moisture-heat resistance of the optically anisotropic layer exhibiting reverse wavelength dispersibility and the adhesiveness between the first optically anisotropic layer and the second optically anisotropic layer, the element ratio is preferably 0.10% to 10.00% by atom, and more preferably 0.20% to 8.00% by atom.

In the optical laminate of the embodiment of the present invention, from the viewpoint of the usefulness of the optical laminate which can be used as a compensating layer for a circularly polarizing plate or a liquid crystal display device, the first optically anisotropic layer is preferably a positive A plate, and more preferably a positive A plate exhibiting reverse wavelength dispersibility.

In addition, in the optical laminate of the embodiment of the present invention, from the viewpoint of optical compensation in the oblique direction of the first optically anisotropic layer, the second optically anisotropic layer is preferably a positive C plate.

Here, the positive A plate (A-plate which is positive) and the positive C plate (C plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A plate satisfies the relationship of Expression (A1) and the positive C plate satisfies the relationship of Expression (C1). Furthermore, the positive A plate has an Rth showing a positive value and the positive C plate has an Rth showing a negative value.

$$nx > ny \approx nz \quad \text{Expression (A1)}$$

$$nz > nx \approx ny \quad \text{Expression (C1)}$$

Moreover, the symbol, "≈", encompasses not only a case where the both sides are completely the same as each other but also a case where the both are substantially the same as each other.

The expression, "substantially the same", means that with regard to the positive A plate, for example, a case where (ny−nz)×d (in which d is the thickness of a film) is −10 to 10 nm, and preferably −5 to 5 nm is also included in "ny≈nz", and a case where (nx−nz)×d is −10 to 10 nm, and preferably −5 to 5 nm is also included in "nx≈nz". In addition, with regard to the positive C plate, for example, a case where (nx−ny)×d (in which d is the thickness of a film) is 0 to 10 nm, and preferably 0 to 5 nm is also included in "nx≈ny".

In a case where the optically anisotropic layer is a positive A plate, the Re(550) is preferably 100 to 180 nm, more preferably 120 to 160 nm, and still more preferably 130 to 150 nm from the viewpoint that the liquid crystal cured layer functions as a λ/4 plate.

Here, the "λ/4 plate" is a plate having a λ/4 function, specifically, a plate having a function of converting a linearly polarized light at a certain specific wavelength into a circularly polarized light (or converting a circularly polarized light to a linearly polarized light).

[Polarizing Plate]

A polarizing plate of an embodiment of the present invention has the above-mentioned optical laminate of the embodiment of the present invention and a polarizer.

In addition, in a case where the above-mentioned optical laminate of the embodiment of the present invention is a λ/4 plate, the polarizing plate of the embodiment of the present invention can be used as a circularly polarizing plate.

In a case where the polarizing plate of the embodiment of the present invention is used as a circularly polarizing plate, the above-mentioned optical laminate of the embodiment of the present invention (in particular, the first optically anisotropic layer) is used as a λ/4 plate (positive A plate), and an angle between the slow axis of the λ/4 plate and the absorption axis of a polarizer which will be described later is preferably 30° to 60°, more preferably 40° to 50°, still more preferably 42° to 48°, and particularly preferably 45°.

Here, the "slow axis" of the λ/4 plate or the positive A plate means a direction in which a refractive index in the plane of the λ/4 plate or the positive A plate is maximum, and the "absorption axis" of the polarizer means a direction in which the absorbance is highest.

[Polarizer]

A polarizer contained in a polarizing plate of an embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dying in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

A polarizer in which thin films having different birefringence are laminated, a wire grid-type polarizer, a polarizer having a combination of a cholesteric liquid crystal having a selective reflection range, a ¼ wavelength plate, and the like is used as the reflective type polarizer.

Among those, a polarizer including a polyvinyl alcohol-based resin (a polymer including $—CH_2—CHOH—$ as a repeating unit, in particular, at least one selected from the group consisting of a polyvinyl alcohol and an ethylene-vinyl alcohol copolymer) is preferable from the viewpoint that it has more excellent adhesiveness.

In the present invention, the thickness of the polarizer is not particularly limited, but is preferably 3 μm to 60 μm, more preferably 3 μm to 30 μm, and still more preferably 3 μm to 10 μm.

[Image Display Device]

An image display device of an embodiment of the present invention is an image display device having the optical laminate of the embodiment of the present invention or the polarizing plate of the embodiment of the present invention.

A display element used in the image display device of the embodiment of the present invention is not particularly limited, and examples thereof include a liquid crystal cell, an organic electroluminescence (hereinafter simply referred to as "EL") display panel, and a plasma display panel.

Among those, the liquid crystal cell or the organic EL display panel is preferable, and the liquid crystal cell is more preferable. That is, as the image display device of the embodiment of the present invention, a liquid crystal display device using a liquid crystal cell as a display element or an organic EL display device using an organic EL display panel as a display element is preferable.

The liquid crystal cell used for the liquid crystal display device is preferably in a vertical alignment (VA) mode, an optically compensated bend (OCB) mode, an in-plane-switching (IPS) mode, a fringe-field-switching (FFS) mode, or a twisted nematic (TN) mode, but is not limited thereto.

Suitable examples of the organic EL display device include an aspect in which a polarizer, the optical laminate of the embodiment of the present invention, and an organic EL display panel are provided in this order from the visual side.

The organic EL display panel is a member in which a light emitting layer or an organic compound thin film including a plurality of light emitting layers is formed between a pair of electrodes, an anode and a cathode, and may have a hole injection layer, a hole transport layer, an electron injection layer, an electron transport layer, a protective layer, and the like, in addition to the light emitting layer, and these layers may have each different functions. Each of various materials can be used for forming each layer.

EXAMPLES

Hereinbelow, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to Examples shown below.

[Synthesis of Monomer mA-1]

The following monomer mA-1 was synthesized with reference to Examples of WO2019/225632A.

mA-1

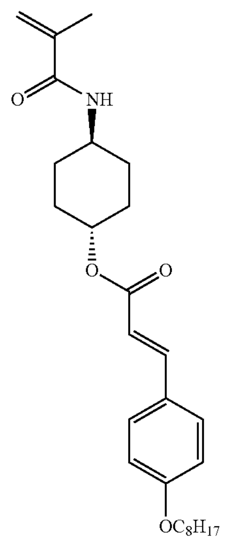

[Synthesis of Monomer mA-2]

The following monomer mA-2 was synthesized according to the following scheme.

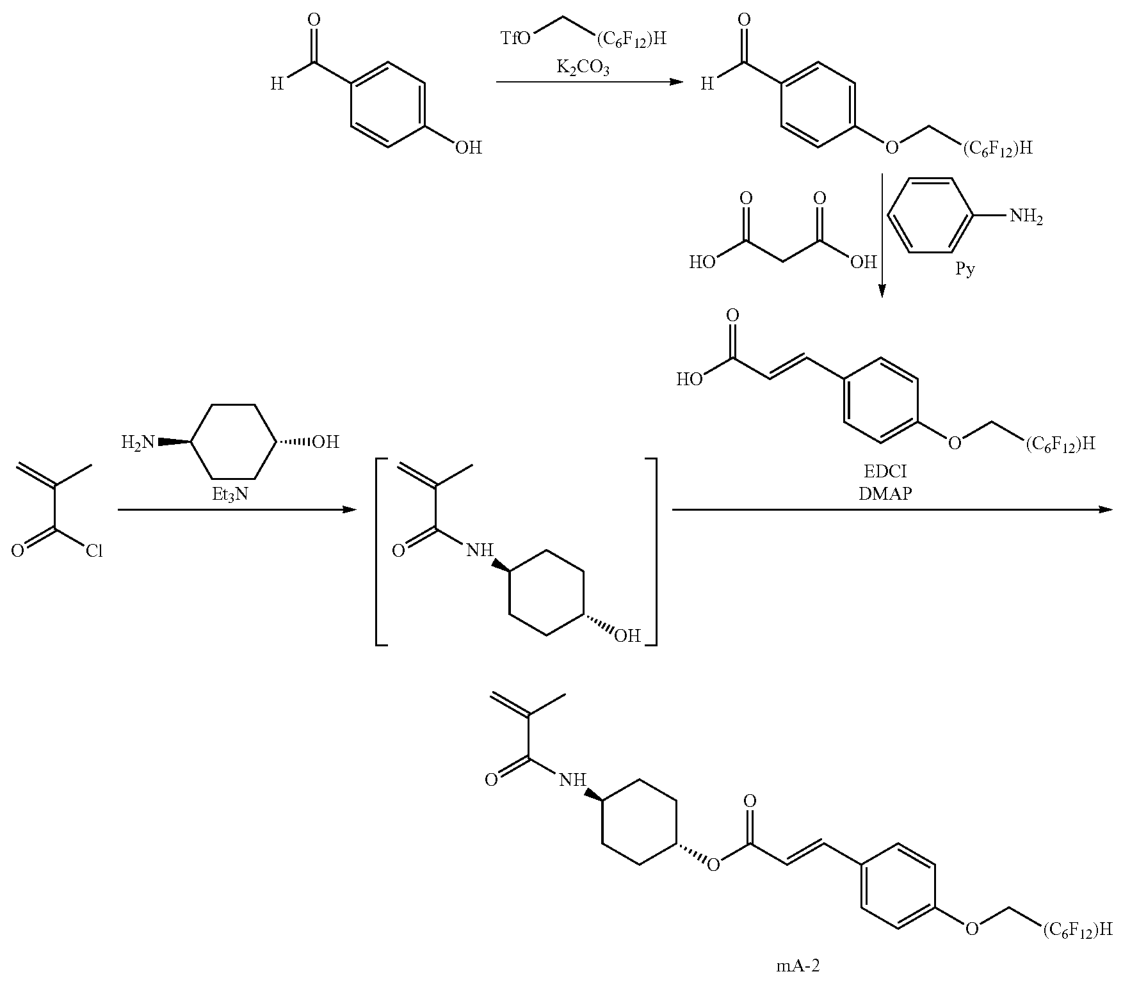

mA-2

[Synthesis of Monomer mB-1c]

Hydroxyethyl methacrylate (100.0 g) and dimethylacetamide (600 mL) were added to a 3 L three-neck flask provided with a stirring blade, a thermometer, a dropping funnel, and a reflux tube, and then while the obtained mixed solution was stirring at 0° C., 3-chloropropionic acid chloride (126.6 g) was added dropwise thereto in the flask, and the mixture was allowed to undergo a reaction at room temperature for 3 hours.

Ethyl acetate (1 L) was added to the obtained reaction solution, the mixture was washed successively with 1 N hydrochloric acid, saturated aqueous sodium bicarbonate, ion exchange water, and saturated saline, and the obtained organic phase was dried over magnesium sulfate. Magnesium sulfate was separated by filtration, the organic phase was concentrated, and the mixture was then purified by a silica gel column (hexane/ethyl acetate=3/1) to obtain 148.8 g of a monomer mB-1c shown below.

mB-1c

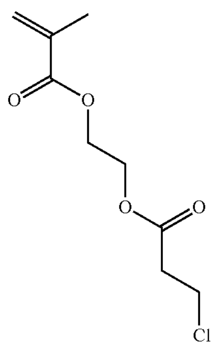

[Synthesis of Photo-Alignment Polymer A-1]

2-Butanone (23 g), 1H,1H,7H-dodecafluoroheptyl methacrylate (1.9 g), the monomer mA-1 (1.7 g), the monomer mB-1c (6.9 g) and 2,2'-azobis(isobutyronitrile) (0.075 g) were charged into a flask equipped with a cooling tube, a thermometer, and a stirrer, and the obtained solution was stirred while maintaining a reflux state for 7 hours by heating in a water bath under the flow of 15 mL/min of nitrogen into the flask.

After completion of the reaction, the reaction solution was left to be cooled to room temperature, and the obtained polymer solution was put into a large excess of methanol to precipitate a polymer. Then, the precipitate was separated by filtration and recovered, and the recovered solid content was washed with a large amount of methanol and then vacuum-dried at 40° C. for 6 hours to obtain a polymer A-1c represented by the following formula.

A-1c

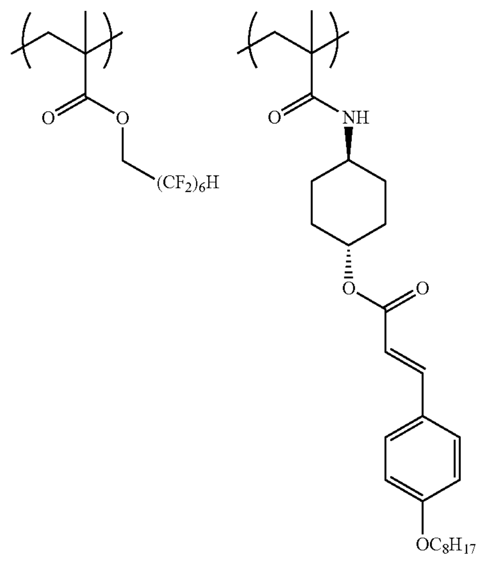

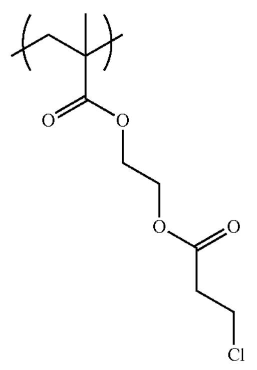

Subsequently, 3.3 g of the polymer A-1c, 4-methoxyphenol (0.016 g), triethylamine (3.75 g), and dimethylacetamide (4.95 g) were charged into a flask provided with a cooling tube, a thermometer, and a stirrer, and the obtained solution was stirred at 60° C. for 4 hours by heating in a water bath.

After completion of the reaction, the reaction solution was left to be cooled to room temperature, and the obtained reaction solution was put into a large excess of methanol/water (1/3) to precipitate a polymer. The precipitate was separated by filtration and recovered, and the precipitate was washed with a large amount of methanol/water (1/3) and then blast dried at 40° C. for 12 hours to obtain a photo-alignment polymer A-1 represented by the following formula.

Furthermore, the numerical value described in each repeating unit in the following structural formula represents a content (% by mass) of each repeating unit with respect to all repeating units, and hereinbelow, the contents are 20% by mass, 18% by mass, and 62% by mass from the repeating unit on the left side.

In addition, the weight-average molecular weight of the photo-alignment polymer A-1 measured by the above-mentioned method was 56,000.

A-1

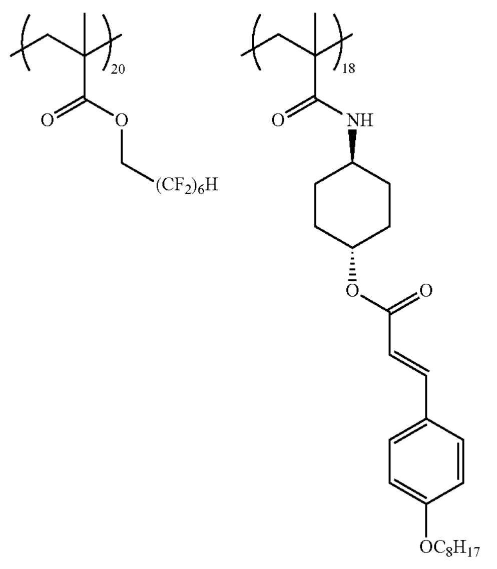

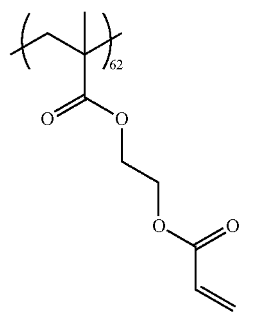

[Synthesis of Photo-Alignment Polymer A-2]

2-Butanone (23 g), the monomer mA-2 (1.8 g), the monomer mB-1c (8.7 g) and 2,2'-azobis(isobutyronitrile) (0.075 g) were charged into a flask equipped with a cooling tube, a thermometer, and a stirrer, and the obtained solution was stirred while maintaining a reflux state for 7 hours by heating in a water bath under the flow of 15 mL/min of nitrogen into the flask.

After completion of the reaction, the reaction solution was left to be cooled to room temperature, and the obtained polymer solution was put into a large excess of methanol to precipitate a polymer. Then, the precipitate was separated by filtration and recovered, and the recovered solid content was washed with a large amount of methanol and then vacuum-dried at 40° C. for 6 hours to obtain a photo-alignment polymer A-2c represented by the following formula.

A-2c

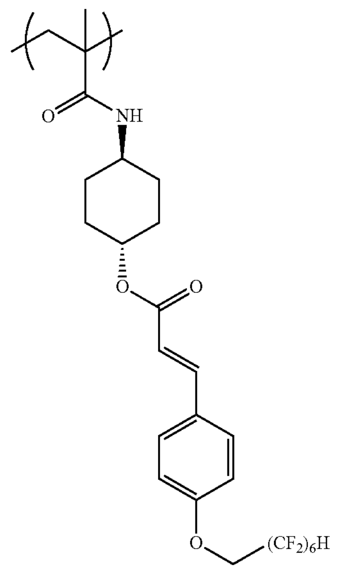

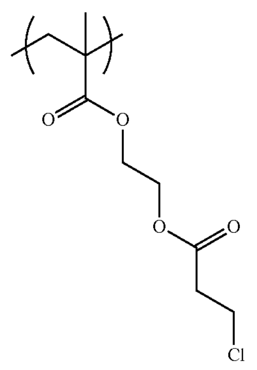

Subsequently, 3.3 g of the polymer A-2c, 4-methoxyphenol (0.016 g), triethylamine (3.75 g), and dimethylacetamide (4.95 g) were charged into a flask provided with a cooling tube, a thermometer, and a stirrer, and the obtained solution was stirred at 60° C. for 4 hours by heating in a water bath.

After completion of the reaction, the reaction solution was left to be cooled to room temperature, and the obtained reaction solution was put into a large excess of methanol/water (1/3) to precipitate a polymer. The precipitate was separated by filtration and recovered, and the precipitate was washed with a large amount of methanol/water (1/3) and then blast dried at 40° C. for 12 hours to obtain a photo-alignment polymer A-2 represented by the following formula.

Furthermore, the numerical value described in each repeating unit in the following structural formula represents a content (% by mass) of each repeating unit with respect to all repeating units, and hereinbelow, the contents are 20% by mass and 80% by mass from the repeating unit on the left side.

In addition, the weight-average molecular weight of the photo-alignment polymer A-2 measured by the above-mentioned method was 58,000.

A-2

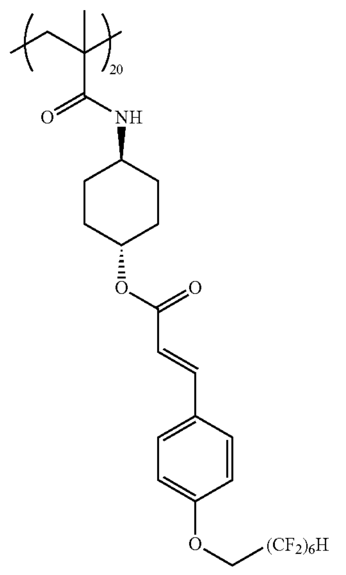

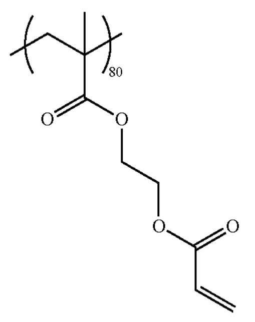

[Synthesis of Photo-Alignment Polymer A-3]

A photo-alignment polymer A-3 was synthesized by the same method as that of the photo-alignment polymer A-1, except that the following monomer mC-1 was used instead of 1H,1H,7H-dodecafluoroheptyl methacrylate.

Furthermore, the numerical value described in each repeating unit in the following structural formula represents a content (% by mass) of each repeating unit with respect to all repeating units, and hereinbelow, the contents are 20% by mass, 18% by mass, and 62% by mass from the repeating unit on the left side.

In addition, the weight-average molecular weight of the photo-alignment polymer A-3 measured by the above-mentioned method was 60,000.

mC-1

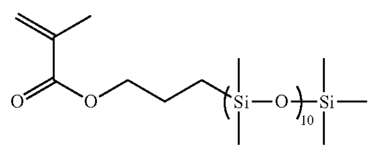

A-3

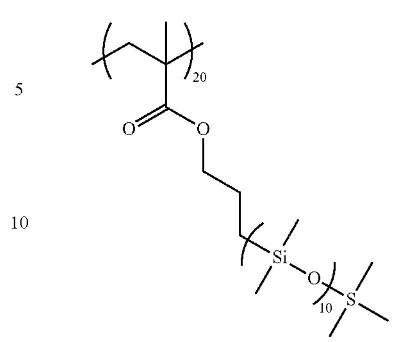

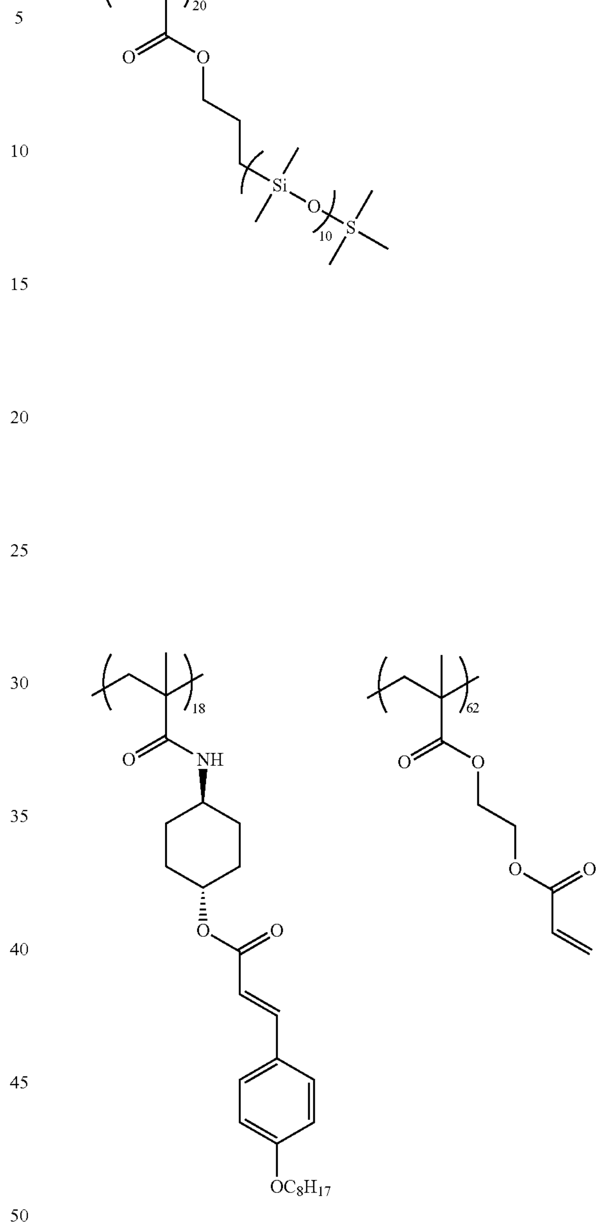

[Synthesis of Photo-Alignment Polymer A-4]

A photo-alignment polymer A-4 was synthesized by the same method for that of the photo-alignment polymer A-1, except that 1H,1H,7H-dodecafluoroheptyl methacrylate (6.0 g), the monomer mA-1 (1.8 g), and monomer mB-1c (2.7 g) were used.

Furthermore, the numerical value described in each repeating unit in the following structural formula represents a content (% by mass) of each repeating unit with respect to all repeating units, and hereinbelow, the contents are 60% by mass, 18% by mass, and 22% by mass from the repeating unit on the left side.

In addition, the weight-average molecular weight of the photo-alignment polymer A-4 measured by the above-mentioned method was 55,000.

A-4

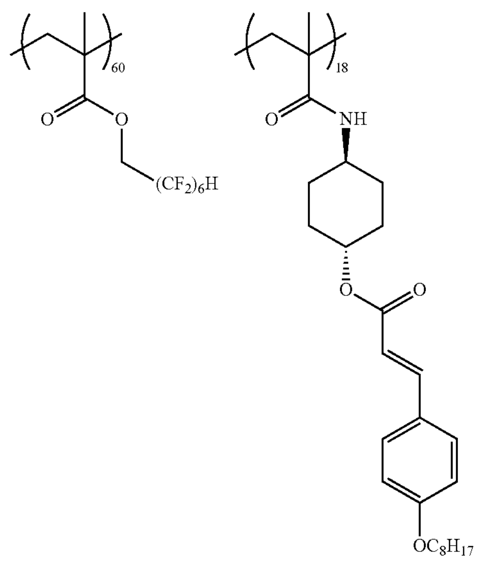

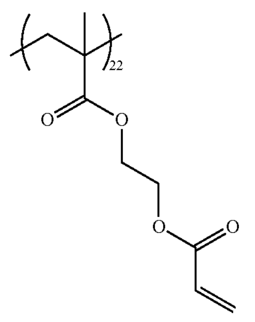

A-5

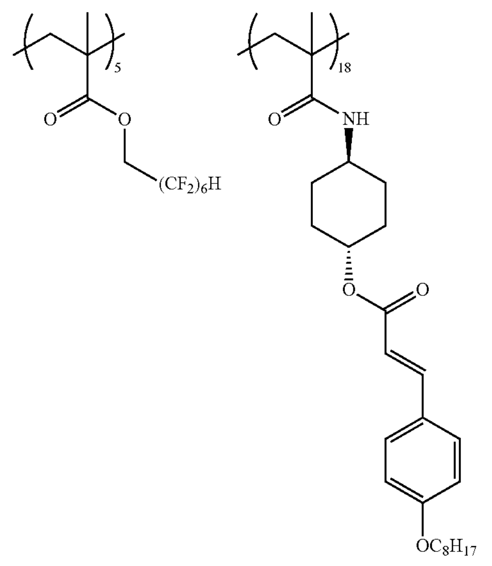

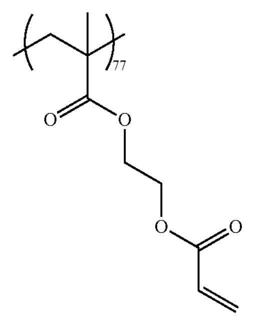

[Synthesis of Photo-Alignment Polymer A-5]

A photo-alignment polymer A-5 was synthesized by the same method for that of the photo-alignment polymer A-1, except that 1H,1H,7H-dodecafluoroheptyl methacrylate (0.5 g), the monomer mA-1 (1.6 g), and monomer mB-1c (8.3 g) were used.

Furthermore, the numerical value described in each repeating unit in the following structural formula represents a content (% by mass) of each repeating unit with respect to all repeating units, and hereinbelow, the contents are 5% by mass, 18% by mass, and 77% by mass from the repeating unit on the left side.

In addition, the weight-average molecular weight of the photo-alignment polymer A-5 measured by the above-mentioned method was 56,000.

[Synthesis of Photo-Alignment Polymer A-6]

A photo-alignment polymer A-6 was synthesized by the same method for that of the photo-alignment polymer A-1, except that 3,3,3-trifluoropropyl methacrylate (2.8 g), the monomer mA-1 (1.7 g), and the monomer mB-1c (5.9 g) were used.

Furthermore, the numerical value described in each repeating unit in the following structural formula represents a content (% by mass) of each repeating unit with respect to all repeating units, and hereinbelow, the contents are 30% by mass, 18% by mass, and 52% by mass from the repeating unit on the left side.

In addition, the weight-average molecular weight of the photo-alignment polymer A-6 measured by the above-mentioned method was 57,000.

A-6

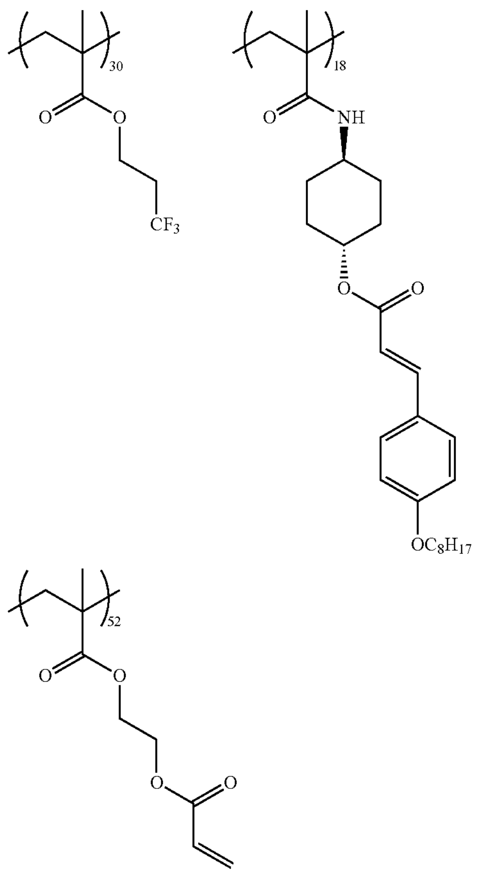

[Synthesis of Photo-Alignment Polymer A-7]

A photo-alignment polymer A-7 was synthesized by the same method as that of the photo-alignment polymer A-1, except that the following monomer mC-2 was used instead of 1H,1H,7H-dodecafluoroheptyl methacrylate.

Furthermore, the numerical value described in each repeating unit in the following structural formula represents a content (% by mass) of each repeating unit with respect to all repeating units, and hereinbelow, the contents are 20% by mass, 18% by mass, and 62% by mass from the repeating unit on the left side.

In addition, the weight-average molecular weight of the photo-alignment polymer A-7 measured by the above-mentioned method was 59,000.

mC-2

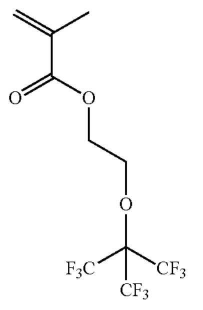

-continued

A-7

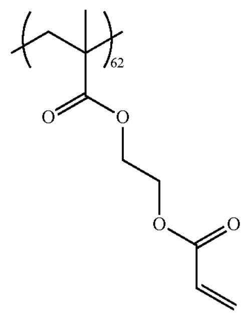

[Synthesis of Photo-Alignment Polymer A-8]

The photo-alignment polymer A-8 shown below was synthesized with reference to the method described in WO2019/159707A.

Furthermore, the numerical value described in each repeating unit in the following structural formula represents a content (% by mass) of each repeating unit with respect to all repeating units, and hereinbelow, the contents are 40% by mass and 60% by mass from the repeating unit on the left side.

In addition, the weight-average molecular weight of the photo-alignment polymer A-8 measured by the above-mentioned method was 61,000.

A-8

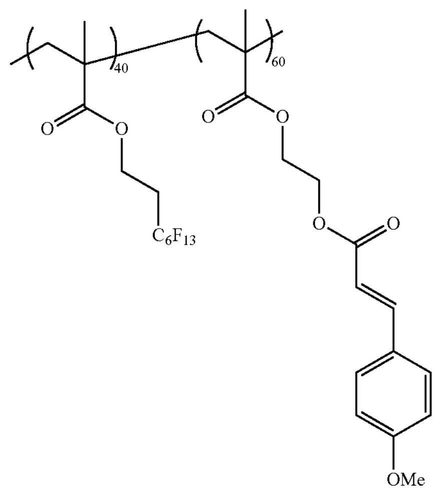

[Synthesis of Photo-Alignment Polymer A-9]

The photo-alignment polymer A-9 shown below was synthesized with reference to the method described in WO2018/216812A.

Furthermore, the numerical value described in each repeating unit in the following structural formula represents a content (% by mass) of each repeating unit with respect to all repeating units, and hereinbelow, the contents are 30% by mass, 50% by mass, 15% by mass, and 5% by mass from the repeating unit on the left side.

In addition, the weight-average molecular weight of the photo-alignment polymer A-9 measured by the above-mentioned method was 57,000.

A-9

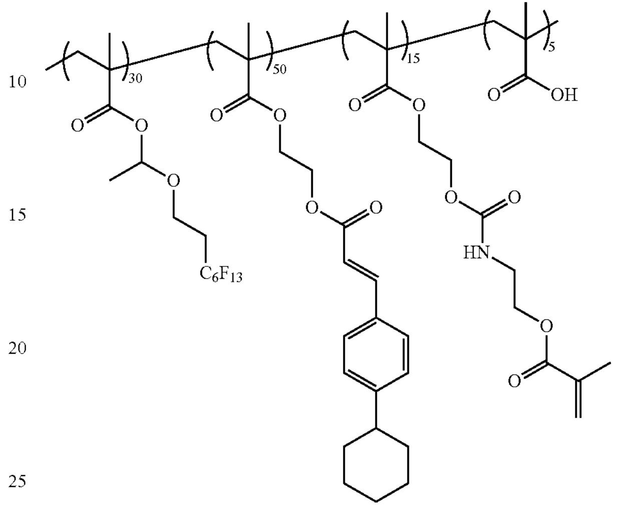

Example 1

[Preparation of Composition for Forming Second Optically Anisotropic Layer]

A composition 1 for forming a second optically anisotropic layer was prepared as follows.

| Composition 1 for forming a second optically anisotropic layer | |
|---|---|
| The following polymerizable liquid crystal compound L-1 | 83.00 parts by mass |
| The following polymerizable liquid crystal compound L-2 | 15.00 parts by mass |
| The following polymerizable liquid crystal compound L-3 | 2.00 parts by mass |
| Polymerizable monomer (A-400, manufactured by Shin-Nakamura Chemical Co., Ltd.) | 4.00 parts by mass |
| The followingpolymerization initiator S-1 (oxime-type) | 5.00 parts by mass |
| The followingpolymer M-1 | 2.00 parts by mass |
| The following vertical alignment agent S01 | 2.00 parts by mass |
| The photo-alignment polymer A-1 | 2.00 parts by mass |
| Methyl ethyl ketone | 41.20 parts by mass |
| Methyl isobutyl ketone | 610.50 parts by mass |

Polymerizable liquid crystal compound L-1

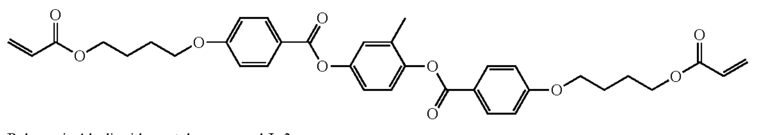

Polymerizable liquid crystal compound L-2

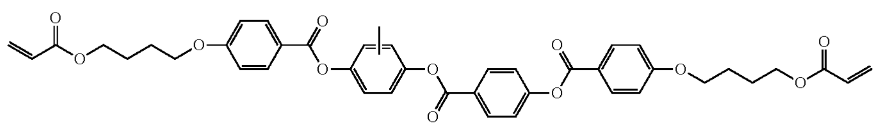

Polymerizable liquid crystal compound L-3

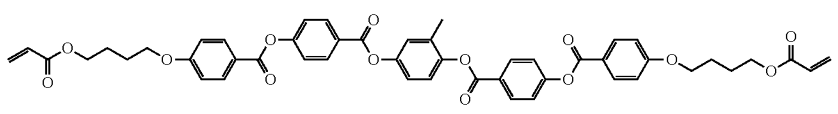 [SMILES: C=CC(=O)OCCCCOc1ccc(C(=O)Oc2ccc(C(=O)Oc3ccc(OC(=O)c4ccc(OC(=O)c5ccc(OCCCCOC(=O)C=C)cc5)cc4)c(C)c3)cc2)cc1]

-continued

| Composition 1 for forming a second optically anisotropic layer |
| --- |

Polymerization initiator S-1

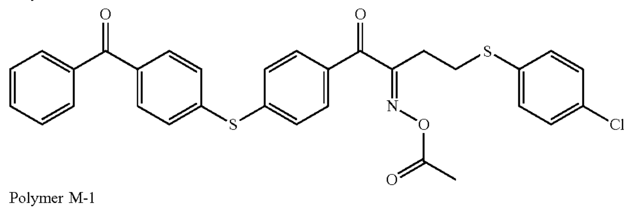

Polymer M-1

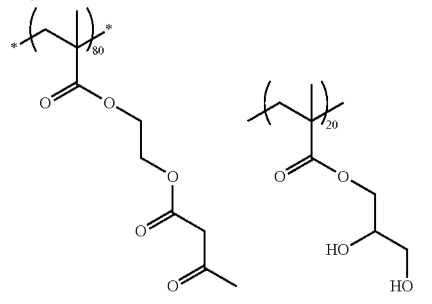

Vertical alignment agent S01

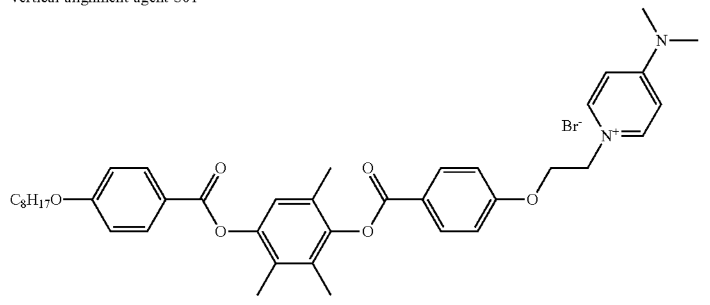

[Formation of Second Optically Anisotropic Layer]

As the cellulose acylate film, the same film as in Example 6 of JP2012-215689A was used. The composition 1 prepared above was applied onto one surface of this film with a wire bar.

Next, the film was heated at 60° C. for 1 minute with warm air and irradiated with ultraviolet rays at an irradiation amount of 100 $mJ/cm^2$ using a UV-LED at 365 nm while purging with nitrogen so as to have an atmosphere having an oxygen concentration of 100 ppm or less, thereby forming a precursor layer.

The obtained precursor layer was irradiated with UV light (ultra-high pressure mercury lamp; UL750; manufactured by HOYA Candeo Optronics Corporation) passing through a wire grid polarizer at room temperature at 7.9 $mJ/cm^2$ (wavelength: 313 nm) to form a second optically anisotropic layer having alignment controllability on the surface.

Furthermore, the second optically anisotropic layer formed was an optically anisotropic layer not exhibiting reverse wavelength dispersibility, and was a positive C plate.

In addition, the film thickness of the second optically anisotropic layer formed was about 0.5

[Formation of First Optically Anisotropic Layer (Upper Layer)]

Next, the following composition 1 for forming a first optically anisotropic layer was applied onto the second optically anisotropic layer with a wire bar. The coating film formed on the second optically anisotropic layer was heated to 120° C. with warm air, then cooled to 60° C., and then irradiated with ultraviolet rays at an irradiation amount of 100 $mJ/cm^2$ using a UV-LED at 365 nm while purging with nitrogen so as to have an atmosphere having an oxygen concentration of 100 ppm or less. Subsequently, the coating film was irradiated with ultraviolet rays at an irradiation amount of 500 $mJ/cm^2$ (wavelength: 365 nm) using an ultra-high pressure mercury lamp (UL750; manufactured by HOYA Candeo Optronics Corporation) while heating to 120° C. and purging nitrogen so as to have an atmosphere having an oxygen concentration of 100 ppm or less. An optical laminate of Example 1 including a first optically anisotropic layer (film thickness: 2.9 μm) was manufactured by the procedure.

Furthermore, the first optically anisotropic layer formed was an optically anisotropic layer exhibiting reverse wavelength dispersibility, and was a positive A plate.

In addition, in the obtained optical laminate, Re(550) derived from the first optically anisotropic layer was 140 nm, Re(450)/Re(550) was 0.82, and Re(650)/Re(550) was 1.04.

| Composition 1 for forming a first optically anisotropic layer | |
|---|---|
| The following polymerizable liquid crystal compound L-4 | 39.00 parts by mass |
| The following polymerizable liquid crystal compound L-5 | 39.00 parts by mass |
| The polymerizable liquid crystal compound L-1 | 17.00 parts by mass |
| The following polymerizable compound A-1 | 5.00 parts by mass |
| The polymerization initiator S-1 (oxime-type) | 0.50 parts by mass |
| Leveling agent (the following compound T-1) | 0.20 parts by mass |
| Cyclopentanone | 235.00 parts by mass |

Polymerizable liquid crystal compound L-4

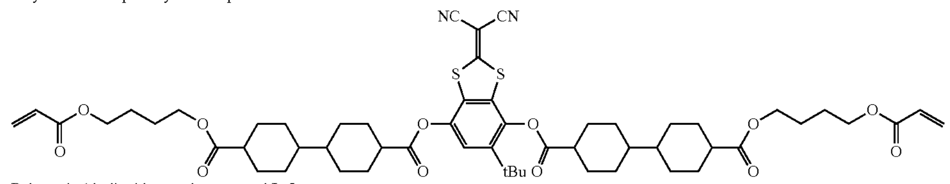

Polymerizable liquid crystal compound L-5

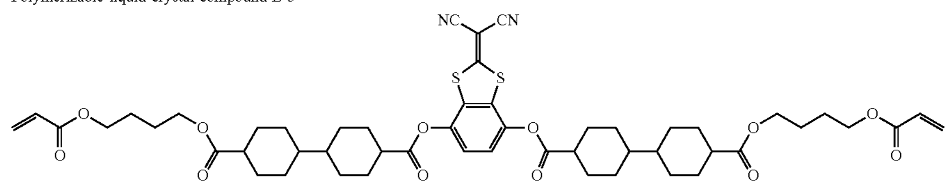

Polymerizable compound A-1

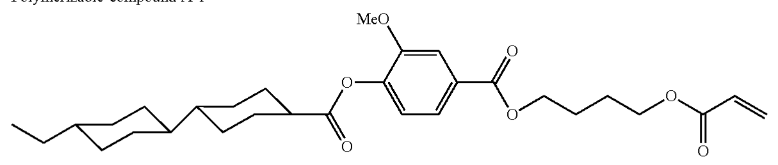

Compound T-1

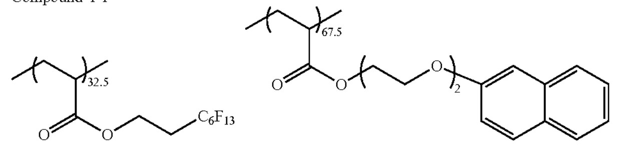

Example 2

An optical laminate was manufactured by the same method as in Example 1, except that the photo-alignment polymer A-1 of Example 1 was changed to the photo-alignment polymer A-2.

Example 3

An optical laminate was manufactured by the same method as in Example 1, except that the photo-alignment polymer A-1 of Example 1 was changed to the photo-alignment polymer A-3.

Example 4

An optical laminate was manufactured by the same method as in Example 1, except that the photo-alignment polymer A-1 of Example 1 was changed to the photo-alignment polymer A-4.

Example 5

An optical laminate was manufactured by the same method as in Example 1, except that the photo-alignment polymer A-1 of Example 1 was changed to the photo-alignment polymer A-5.

Example 6

An optical laminate was manufactured by the same method as in Example 1, except that the photo-alignment polymer A-1 of Example 1 was changed to the photo-alignment polymer A-6.

Example 7

An optical laminate was manufactured by the same method as in Example 1, except that the composition 1 forming a first optically anisotropic layer of Example 1 was changed to the following composition 2 forming a first optically anisotropic layer.

Furthermore, the first optically anisotropic layer formed was an optically anisotropic layer exhibiting reverse wavelength dispersibility, and was a positive A plate.

In addition, in the obtained optical laminate, Re(550) derived from the first optically anisotropic layer was 140 nm, Re(450)/Re(550) was 0.82, and Re(650)/Re(550) was 1.04.

| Composition 2 for forming a first optically anisotropic layer | |
|---|---|
| The following polymerizable liquid crystal compound L-6 | 12.00 parts by mass |
| Leveling agent (BYK-361N, manufactured by BYK-Chemie) | 0.12 parts by mass |
| Polymerization initiator (Irgacure 369, manufactured by BASF) | 0.72 parts by mass |
| Cyclopentanone | 100.00 parts by mass |

Polymerizable liquid crystal compound L-6

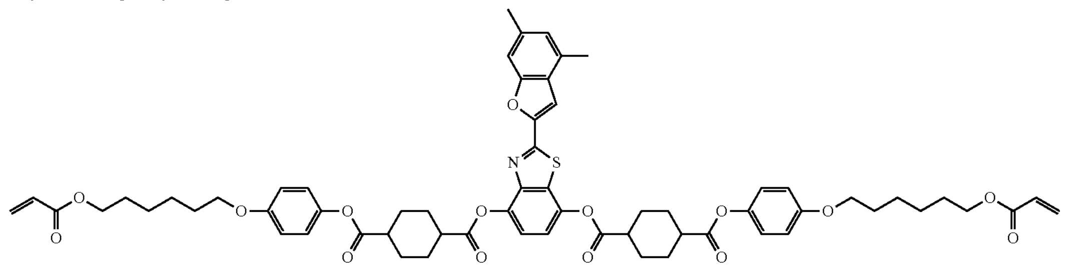

Example 8

An optical laminate was manufactured by the same method as in Example 1, except that the amount of the photo-alignment polymer A-1 in the composition 1 for forming a second optically anisotropic layer of Example 1 was changed to 5.00 parts by mass.

Example 9

An optical laminate was manufactured by the same method as in Example 1, except that the amount of the photo-alignment polymer A-1 in the composition 1 for forming a second optically anisotropic layer of Example 1 was changed to 15.00 parts by mass.

Example 10

An optical laminate was manufactured by the same method as in Example 1, except that the photo-alignment polymer A-1 of Example 1 was changed to the photo-alignment polymer A-7.

Example 11

An optical laminate was manufactured by the same method as in Example 1, except that the composition 1 forming a second optically anisotropic layer of Example 1 was changed to the following composition 2 forming a second optically anisotropic layer.

| Composition 2 for forming a second optically anisotropic layer | |
|---|---|
| The polymerizable liquid crystal compound L-1 | 83.00 parts by mass |
| The polymerizable liquid crystal compound L-2 | 15.00 parts by mass |
| The polymerizable liquid crystal compound L-3 | 2.00 parts by mass |
| Polymerizable monomer (A-400, manufactured by Shin-Nakamura Chemical Co., Ltd.) | 4.00 parts by mass |
| The polymerization initiator S-1 (oxime-type) | 5.00 parts by mass |
| The polymer M-1 | 2.00 parts by mass |
| The vertical alignment agent S01 | 2.00 parts by mass |
| The photo-alignment polymer A-1 | 2.00 parts by mass |
| The following surfactant B-1 (weight-average molecular weight: 2,200) | 0.20 parts by mass |
| Methyl ethyl ketone | 41.20 parts by mass |
| Methyl isobutyl ketone | 610.50 parts by mass |

Surfactant B-1

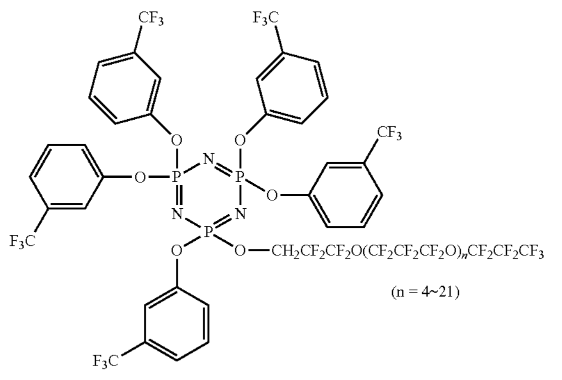

(n = 4~21)

Comparative Example 1

An optical laminate was manufactured by the same method as in Example 1, except that the photo-alignment polymer A-1 of Example 1 was changed to the photo-alignment polymer A-8.

Comparative Example 2

An optical laminate was manufactured by the same method as in Example 1, except that the formation of the second optically anisotropic layer of Example 1 was changed as follows.

[Preparation of Composition for Forming Second Optically Anisotropic Layer]

A composition 3 for forming a second optically anisotropic layer was prepared as follows.

| Composition 3 for forming a second optically anisotropic layer | |
|---|---|
| The polymerizable liquid crystal compound L-1 | 83.00 parts by mass |
| The polymerizable liquid crystal compound L-2 | 15.00 parts by mass |
| The polymerizable liquid crystal compound L-3 | 2.00 parts by mass |
| Polymerizable monomer (A-400, manufactured by Shin-Nakamura Chemical Co., Ltd.) | 4.00 parts by mass |
| The polymerization initiator S-1 (oxime-type) | 5.00 parts by mass |
| The following photoacid generator D-1 | 3.00 parts by mass |
| The polymer M-1 | 2.00 parts by mass |
| The vertical alignment agent S01 | 2.00 parts by mass |
| Photo-alignment polymer A-9 | 2.00 parts by mass |
| Methyl ethyl ketone | 42.30 parts by mass |
| Methyl isobutyl ketone | 627.50 parts by mass |

Photoacid generator D-1

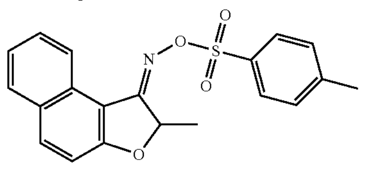

[Formation of Second Optically Anisotropic Layer]

As the cellulose acylate film, the same film as in Example 6 of JP2012-215689A was used. The composition 2 prepared above was applied onto one surface of this film with a wire bar of #3.0. Next, the mixture was heated at 60° C. for 1 minute with warm air and irradiated with ultraviolet rays at an irradiation amount of 100 mJ/cm$^2$ using a UV-LED at 365 nm while purging with nitrogen so as to have an atmosphere having an oxygen concentration of 100 ppm or less.

Then, the film was annealed with warm air at 120° C. for 1 minute to form a precursor layer.

The obtained precursor layer was irradiated with UV light (ultra-high pressure mercury lamp; UL750; manufactured by HOYA Candeo Optronics Corporation) passing through a wire grid polarizer at room temperature at 7.9 mJ/cm$^2$ (wavelength: 313 nm) to form a second optically anisotropic layer having alignment controllability on the surface.

Furthermore, the second optically anisotropic layer formed was an optically anisotropic layer not exhibiting reverse wavelength dispersibility, and was a positive C plate.

Furthermore, the film thickness of the second optically anisotropic layer formed was about 0.5

Comparative Example 3

An optical laminate was manufactured by the same method as in Example 7, except that the photo-alignment polymer A-1 of Example 7 was changed to the photo-alignment polymer A-8.

Comparative Example 4

An optical laminate was manufactured by the same method as in Comparative Example 2, except that the composition 1 forming a first optically anisotropic layer of Comparative Example 2 was changed to the composition 1 forming a second optically anisotropic layer.

With respect to the optical laminates obtained in Examples 1 to 11 and Comparative Examples 1 to 4, the presence or absence of the photo-alignment polymer on a surface (hereinafter simply referred to as an "interface" in the present paragraph and Table 4 below) of the second optically anisotropic layer on the side in contact with the first optically anisotropic layer was confirmed, and an element ratio of fluorine or silicon at the interface was measured. The measurement results are shown in Table 4 below.

Furthermore, in Table 4 below, in Comparative Examples 2 and 4 in which the photo-alignment polymer A-9 was used, the presence or absence of the photo-alignment polymer at the interface was evaluated as "Present", but in the photo-alignment polymer A-9 synthesized by the method described in WO2018/216812A, since the cleavage group decomposes during the formation of the second optically anisotropic layer, so that the fluorine atom or the silicon atom is volatilized the photo-alignment polymer A-9 having a photo-alignment group is present at the interface, but the photo-alignment polymer having a photo-alignment group and a fluorine atom or a silicon atom is not present at the interface.

[Moisture-Heat Resistance]

From the optical laminates obtained in Examples 1 to 11 and Comparative Examples 1 to 4, a square-shaped film having a side length of 40 mm was cut out.

A pressure-sensitive adhesive was bonded to a surface of the obtained film on the first optically anisotropic layer side, the pressure-sensitive adhesive surface was bonded to glass having the same size as the film, and then the substrate of the film was peeled off (the first and second optically anisotropic layers were transferred).

The obtained square-shaped material having a side length of 40 mm was held in an environment of a temperature of 100° C. and a humidity of 95% for 144 hours, and then Re(550) (an in-plane retardation at a wavelength of 550 nm) was measured and evaluated according to the following standard. The results are shown in Table 4 below.

Furthermore, since the optically anisotropic layer having a great influence on the measurement results of Re(550) is the positive A plate, it can be said that the evaluation based on the following standard is an evaluation of the moisture-heat resistance of the optically anisotropic layer exhibiting reverse wavelength dispersibility.

A: A case where the ratio of Re(550) after being held in an environment of a temperature of 100° C. and a humidity of 95% is 98% or more with respect to Re(550) before being held under the environment.

B: A case where the ratio of Re(550) after being held in an environment of a temperature of 100° C. and a humidity of 95% is 96% or more and less than 98% with respect to Re(550) before being held under the environment.

C: A case where the ratio of Re(550) after being held in an environment of a temperature of 100° C. and a humidity of 95% is less than 96% or more with respect to Re(550) before being held under the environment.

[Adhesiveness]

The adhesiveness between the first optically anisotropic layer and the second optically anisotropic layer was evaluated by a grid test (cross-cut method). A specific procedure thereof is shown below.

First, the optically anisotropic layer sides of the optical laminates obtained in Examples 1 to 11 and Comparative Examples 1 to 4 were treated once under the conditions of an output of 0.3 kW and a treatment speed of 7.6 m/min, using a corona treatment device.

Next, a square-shaped film having a side length of 40 mm was cut out.

A pressure-sensitive adhesive was bonded to a surface of the first optically anisotropic layer of the obtained film, the pressure-sensitive adhesive surface was bonded to glass having the same size as the film, and then the substrate of the film was peeled off (the first and second optically anisotropic layers were transferred).

Next, 11 notches at 1 mm intervals were made on the surface of the second optically anisotropic layer using a cutter knife and a cutter guide to manufacture 100 grids. An operation of crimping a cellophane tape (registered trademark) onto the grid and then peeling off the cellophane tape (registered trademark) was performed three times in total by replacing the cellophane tape (registered trademark) with a new one each time. Then, the state of the grid was observed, and the number of grids from which the second optically anisotropic layer was peeled off was counted. The number of the peeled pieces on the grid was evaluated by applying the following evaluation standard. Furthermore, peeling between the pressure-sensitive adhesive and the first optically anisotropic layer did not occur. The results are shown in Table 4 below.

A: The number of peeled pieces of the grid is 0.

B: The number of peeled pieces of the grid is 1 to 5.

C: The number of peeled grids is 5 or more.

TABLE 4

| | Second optically anisotropic layer | | | | | First optically anisotropic layer Composition for forming optically anisotropic layer | Evaluation results | |
|---|---|---|---|---|---|---|---|---|
| | Photo-alignment polymer | | Presence or absence at interface | Element ratio at interface (% by atom) | | | Moisture-heat resistance | Adhesiveness |
| | Type | Addition amount (parts by mass) | | Fluorine | Silicon | | | |
| Example 1 | A-1 | 2.00 | Present | 0.27 | 0.00 | Composition 1 | A | A |
| Example 2 | A-2 | 2.00 | Present | 0.30 | 0.00 | Composition 1 | A | A |
| Example 3 | A-3 | 2.00 | Present | 0.00 | 0.09 | Composition 1 | B | A |
| Example 4 | A-4 | 2.00 | Present | 0.97 | 0.00 | Composition 1 | A | A |
| Example 5 | A-5 | 2.00 | Present | 0.08 | 0.00 | Composition 1 | B | A |
| Example 6 | A-6 | 2.00 | Present | 0.06 | 0.00 | Composition 1 | B | A |
| Example 7 | A-1 | 2.00 | Present | 0.32 | 0.00 | Composition 2 | A | A |
| Example 8 | A-1 | 5.00 | Present | 2.00 | 0.00 | Composition 1 | A | A |
| Example 9 | A-1 | 15.00 | Present | 8.41 | 0.00 | Composition 1 | A | B |
| Example 10 | A-7 | 2.00 | Present | 0.28 | 0.00 | Composition 1 | A | A |
| Example 11 | A-1 | 2.00 | Present | 0.27 | 0.00 | Composition 1 | A | A |
| Comparative Example 1 | A-8 | 2.00 | Present | 19.00 | 0.00 | Composition 1 | A | C |
| Comparative Example 2 | A-9 | 2.00 | Present | 0.00 | 0.00 | Composition 1 | C | A |
| Comparative Example 3 | A-8 | 2.00 | Present | 18.57 | 0.00 | Composition 2 | A | C |
| Comparative Example 4 | A-9 | 2.00 | Present | 0.00 | 0.00 | Composition 2 | C | A |

From the results shown in Table 4, it was found that the element ratio of fluorine or silicon on the surface of the second optically anisotropic layer on the side in contact with the first optically anisotropic layer is more than 15.00% by atom, the adhesiveness between the first optically anisotropic layer and the second optically anisotropic layer is deteriorated (Comparative Examples 1 and 3).

In addition, it was found that in a case where a photo-alignment polymer A-8 synthesized by the method described in WO2018/216812A is used, the element ratio of fluorine or silicon on the surface is 0% by atom on a surface of the second optically anisotropic layer on a side in contact with the first optically anisotropic layer, and therefore, the moisture-heat resistance of the optically anisotropic layer exhibiting reverse wavelength dispersibility is deteriorated (Comparative Examples 2 and 4).

In contrast, it was found that the photo-alignment polymer is present on a surface of the second optically anisotropic layer on a side in contact with the first optically anisotropic layer such that the element ratio of fluorine or silicon is 0.05% to 15.00% by atom, the moisture-heat resistance of the optically anisotropic layer exhibiting reverse wavelength dispersibility is improved and the adhesiveness between the first optically anisotropic layer and the second optically anisotropic layer is also improved (Examples 1 to 11).

Moreover, from the comparison of Example 1 vs. Example 2, it was found that in any of a case where the photo-alignment polymer is a polymer having a repeating unit including a fluorine atom or a silicon atom together with a photo-alignment group, or a case where the photo-alignment polymer is copolymer having a repeating unit including a photo-alignment group and a repeating unit including a fluorine atom or a silicon atom, the same effect can be obtained.

Furthermore, from the comparison of Examples 1 and 2 vs. Example 3, it was found that the moisture-heat resistance of the optically anisotropic layer exhibiting reverse wavelength dispersibility is further improved by using a photo-alignment polymer having a photo-alignment group and a fluorine atom rather than using photo-alignment polymer having a photo-alignment group and a silicon atom.

In addition, from the comparison of Example 1 vs. Example 6, it was found that in a case where the photo-alignment polymer has the partial structure represented by Formula (1), the moisture-heat resistance of the optically anisotropic layer exhibiting reverse wavelength dispersibility is further improved.

Moreover, from the comparison of Examples 1, 8 and 9, it was found that in a case where the element ratio of fluorine or silicon on a surface of the second optically anisotropic layer on a side in contact with the first optically anisotropic layer was 0.20% to 8.00% by atom, a balance between the moisture-heat resistance of the optically anisotropic layer exhibiting reverse wavelength dispersibility and the adhesiveness between the first optically anisotropic layer and the second optically anisotropic layer is improved.

In addition, from the results of Example 11, it is found that also in a case where a surfactant having high elution properties is blended in the second composition for forming an optically anisotropic layer, the same results as those of Example 1 can be obtained.

What is claimed is:

1. An optical laminate comprising:

a first optically anisotropic layer; and a second optically anisotropic layer, wherein both of the first optically anisotropic layer and the second optically anisotropic layer are arranged in direct contact with each other and each of the first optically anisotropic layer and the second optically anisotropic layer consists of a liquid crystal layer, at least one of the first optically anisotropic layer or the second optically anisotropic layer exhibits reverse wavelength dispersibility, a photo-alignment polymer having a photo-alignment group and a fluorine atom or a silicon atom is present on a surface of the second optically anisotropic layer on a side in contact with the first optically anisotropic layer, and an atomic percentage of fluorine or silicon on the surface of the second optically anisotropic layer on the side in contact with the first optically anisotropic layer is 0.05% to 15.00%.

2. The optical laminate according to claim 1, wherein the photo-alignment group is a photo-alignment group that undergoes at least one of dimerization or isomerization by an action of light.

3. The optical laminate according to claim 1, wherein the photo-alignment group is selected from the group consisting of a cinnamoyl group, an azobenzene group, a chalconyl group, and a coumarin group.

4. The optical laminate according to claim 1, wherein the photo-alignment polymer has a repeating unit represented by Formula (A), (A)

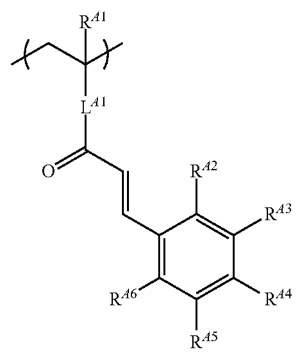

in Formula (A), $R^{A1}$ represents a hydrogen atom or a substituent, $L^{A1}$ represents a single bond or a divalent linking group, and $R^{A2}$, $R^{A3}$, $R^{A4}$, $R^{A5}$, and $R^{A6}$ each independently represent a hydrogen atom or a substituent, and two adjacent groups of $R^{A2}$, $R^{A3}$, $R^{A4}$, $R^{A5}$, and $R^{A6}$ may be bonded to each other to form a ring.

5. The optical laminate according to claim 1, wherein the photo-alignment polymer has a partial structure represented by Formula (1),

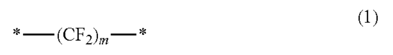

$$*-(CF_2)_m-* \quad (1)$$

in Formula (1), * represents a bonding position, and m represents an integer of 2 to 20.

6. The optical laminate according to claim 1, wherein the photo-alignment polymer has a group represented by Formula (2),

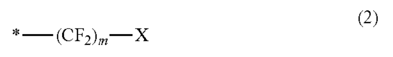

$$*-(CF_2)_m-X \quad (2)$$

in Formula (2), * represents a bonding position, m represents an integer of 2 to 20, and X represents a hydrogen atom or a fluorine atom.

7. The optical laminate according to claim 6, wherein X in Formula (2) represents a hydrogen atom.

8. The optical laminate according to claim 1, wherein the photo-alignment polymer has a group represented by Formula (3),

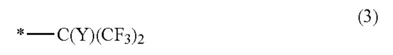

$$*-C(Y)(CF_3)_2 \quad (3)$$

in Formula (3), * represents a bonding position, and Y represents a hydrogen atom or a substituent.

9. The optical laminate according to claim 1, wherein at least one of the first optically anisotropic layer or the second optically anisotropic layer is an optically anisotropic layer in which an alignment of a liquid crystal compound having any of aromatic rings selected from the group consisting of groups represented by Formulae (Ar-1) to (Ar-7) is immobilized, -continued (Ar-1)

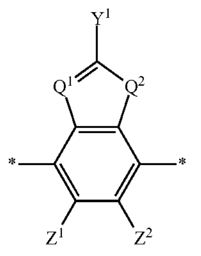

(Ar-2)

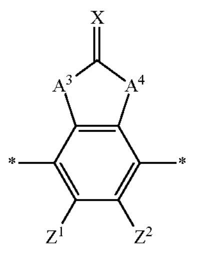

(Ar-3)

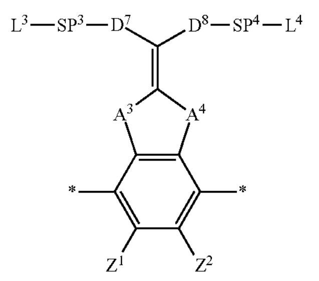

(Ar-4)

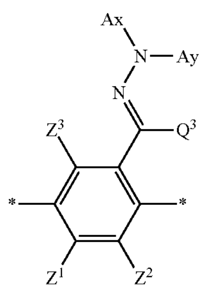

(Ar-5)

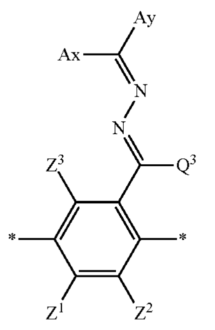

(Ar-6)

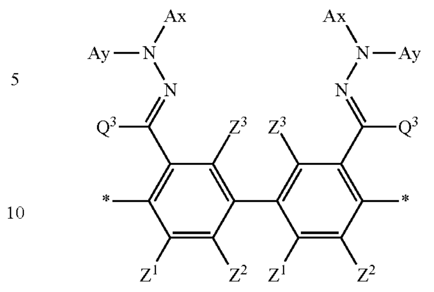

(Ar-7)

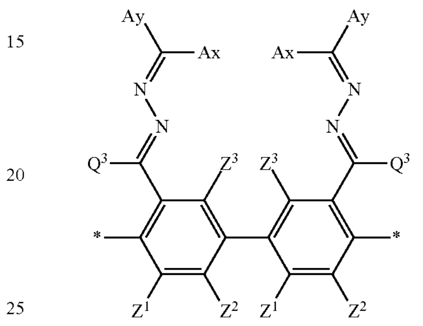

in Formulae (Ar-1) to (Ar-7),

* represents a bonding position, $Q^1$ represents N or CH, $Q^2$ represents —S—, —O—, or —N($R^6$)—, where $R^6$ represents a hydrogen atom or an alkyl group having 1 to 6 carbon atoms, $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, where one or more of —$CH_2$—'s constituting the alicyclic hydrocarbon group may be substituted with —O—, —S—, or —NH—, $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —$OR^7$, —$NR^8R^9$, —$SR^{10}$, —$COOR^{11}$, or —$COR^{12}$, where $R^7$ to $R^{12}$ each independently represent a hydrogen atom or an alkyl group having 1 to 6 carbon atoms, and $Z^1$ and $Z^2$ may be bonded to each other to form an aromatic ring, $A^3$ and $A^4$ each independently represent a group selected from the group consisting of —O—, —N($R^{13}$)—, —S—, and —CO—, where $R^{13}$ represents a hydrogen atom or a substituent, X represents a hydrogen atom or a non-metal atom of Groups XIV to XVI, to which a substituent may be bonded, $D^7$ and $D^8$ each independently represent a single bond, —CO—, —O—, —S—, —C(=S)—, —$CR^1R^2$—, —$CR^3$—$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, where Q represents a substituent, $L^3$ and $L^4$ each independently represent a monovalent organic group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and $Q^3$ represents a hydrogen atom or an alkyl group having 1 to 20 carbon atoms, which may have a substituent.

10. The optical laminate according to claim 1, wherein the first optically anisotropic layer is a positive A plate.

11. The optical laminate according to claim 1, wherein the second optically anisotropic layer is a positive C plate.

12. A polarizing plate comprising:

the optical laminate according to claim 1; and a polarizer.

13. An image display device comprising the optical laminate according to claim 1.

* * * * *